(12) United States Patent
Grobis et al.

(10) Patent No.: US 10,553,647 B2
(45) Date of Patent: Feb. 4, 2020

(54) METHODS AND APPARATUS FOR THREE-DIMENSIONAL NON-VOLATILE MEMORY

(71) Applicant: SANDISK TECHNOLOGIES LLC, Addison, TX (US)

(72) Inventors: Michael K. Grobis, Campbell, CA (US); Derek Stewart, Livermore, CA (US); Bruce D. Terris, Sunnyvale, CA (US)

(73) Assignee: SanDisk Technologies LLC, Addison, TX (US)

( * ) Notice: Subject to any disclaimer, the term of this patent is extended or adjusted under 35 U.S.C. 154(b) by 23 days.

(21) Appl. No.: 16/021,804

(22) Filed: Jun. 28, 2018

(65) Prior Publication Data

US 2020/0006432 A1    Jan. 2, 2020

(51) Int. Cl.
| | | |
|---|---|---|
| *H01L 27/24* | (2006.01) | |
| *H01L 45/00* | (2006.01) | |
| *H01L 27/22* | (2006.01) | |
| *H01L 43/02* | (2006.01) | |
| *H01L 43/12* | (2006.01) | |
| *G11C 13/00* | (2006.01) | |
| *G11C 11/16* | (2006.01) | |

(52) U.S. Cl.
CPC ...... *H01L 27/2481* (2013.01); *G11C 11/1673* (2013.01); *G11C 11/1675* (2013.01);
(Continued)

(58) Field of Classification Search
CPC ............... H01L 27/224; H01L 27/2418; H01L 27/2427; H01L 27/2463; H01L 27/2472; H01L 27/2481; H01L 27/249; H01L 45/06; H01L 45/08; H01L 45/122; H01L 45/1226; H01L 45/1233; H01L 45/141; H01L 45/145; H01L 45/146; H01L 45/147; H01L 45/16; H01L 45/1608; H01L 45/1666; H01L 45/1675; G11C 11/56; G11C 11/5614; G11C 11/5678; G11C 11/5685; G11C 13/0004; G11C 13/0007; G11C 13/0011
See application file for complete search history.

(56) References Cited

U.S. PATENT DOCUMENTS

| | | | |
|---|---|---|---|
| 8,665,630 B2 * | 3/2014 | Meade ............... | G11C 13/0004 365/148 |
| 10,355,049 B1 * | 7/2019 | Grobis ................. | H01L 27/228 |

(Continued)

OTHER PUBLICATIONS

Notice of Allowance dated Apr. 4, 2019 in U.S. Appl. No. 16/021,776.
(Continued)

*Primary Examiner* — Stephen W Smoot
(74) *Attorney, Agent, or Firm* — Vierra Magen Marcus LLP

(57) ABSTRACT

An apparatus is provided that includes a bit line above a substrate, a word line above the substrate, and a non-volatile memory cell between the bit line and the word line. The non-volatile memory cell includes a reversible resistance-switching memory element coupled in series with an isolation element. The isolation element includes a first selector element coupled in series with a second selector element. The first selector element includes a first snapback current, and the second selector element includes a second snapback current lower than the first snapback current.

21 Claims, 23 Drawing Sheets

(52) U.S. Cl.
CPC ........ *G11C 13/0004* (2013.01); *G11C 13/004* (2013.01); *G11C 13/0069* (2013.01); *H01L 27/224* (2013.01); *H01L 27/2418* (2013.01); *H01L 27/2427* (2013.01); *H01L 43/02* (2013.01); *H01L 43/12* (2013.01); *H01L 45/06* (2013.01); *H01L 45/08* (2013.01); *H01L 45/1233* (2013.01); *H01L 45/141* (2013.01); *H01L 45/16* (2013.01); *G11C 2013/005* (2013.01); *G11C 2013/009* (2013.01); *G11C 2213/71* (2013.01); *H01L 45/144* (2013.01); *H01L 45/146* (2013.01); *H01L 45/147* (2013.01)

(56) References Cited

U.S. PATENT DOCUMENTS

| | | | | |
|---|---|---|---|---|
| 2009/0001342 | A1* | 1/2009 | Schricker | G11C 13/0007 257/4 |
| 2009/0323392 | A1* | 12/2009 | Fasoli | G11C 13/0007 365/148 |
| 2011/0037043 | A1* | 2/2011 | Wada | G11C 13/0007 257/2 |
| 2012/0313072 | A1 | 12/2012 | Baek et al. | |
| 2015/0340406 | A1* | 11/2015 | Jo | H01L 45/122 29/604 |
| 2016/0093373 | A1* | 3/2016 | Siau | G11C 13/004 365/148 |
| 2018/0075904 | A1 | 3/2018 | Ge et al. | |
| 2018/0138292 | A1* | 5/2018 | Padilla | H01L 27/2454 |

OTHER PUBLICATIONS

U.S. Appl. No. 16/021,776, filed Jun. 28, 2018.
Response to Office Action filed Dec. 11, 2018 in U.S. Appl. No. 16/021,776.
Office Action dated Sep. 20, 2018 in U.S. Appl. No. 16/021,776.

* cited by examiner

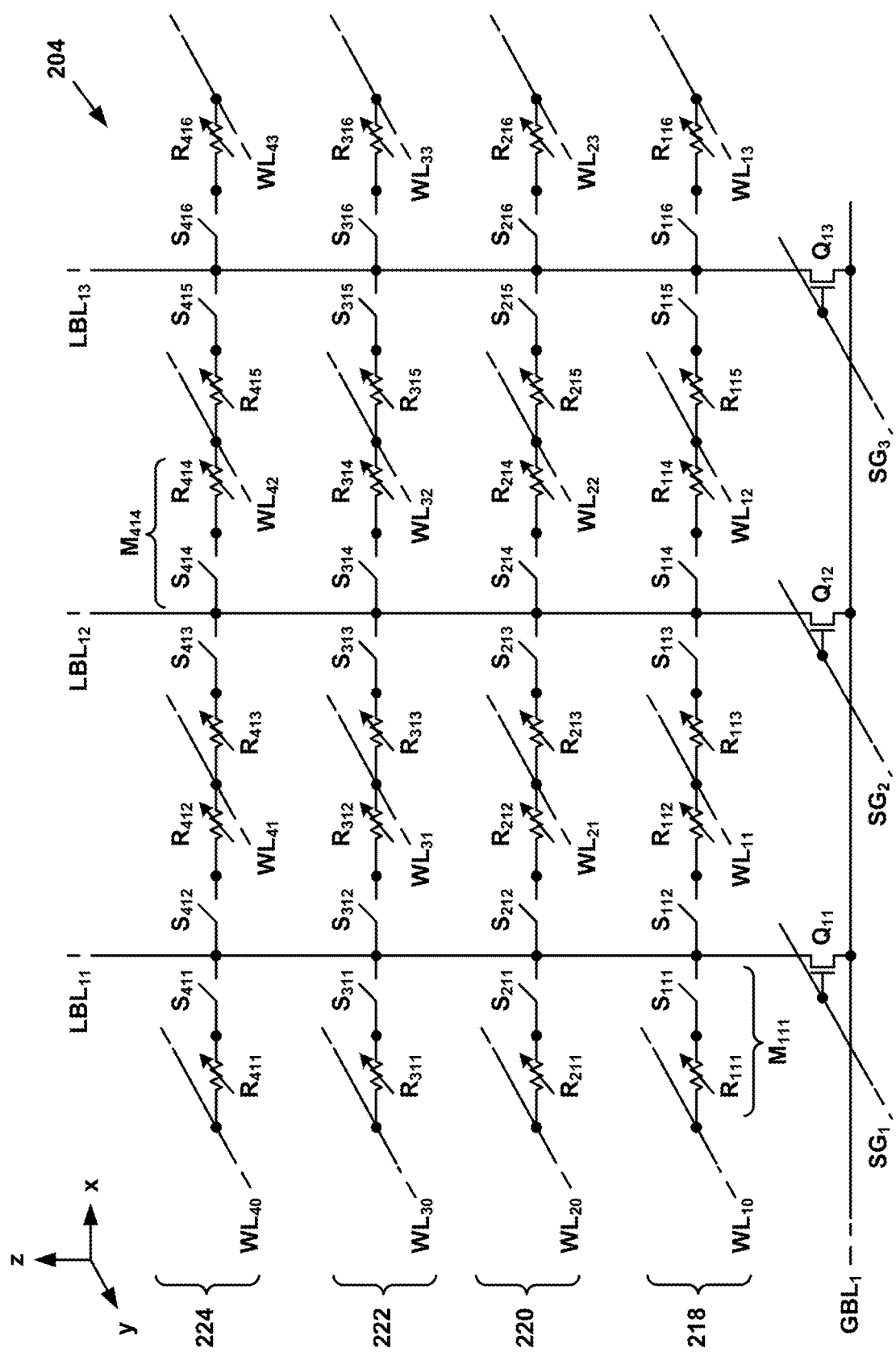
FIG. 2C1

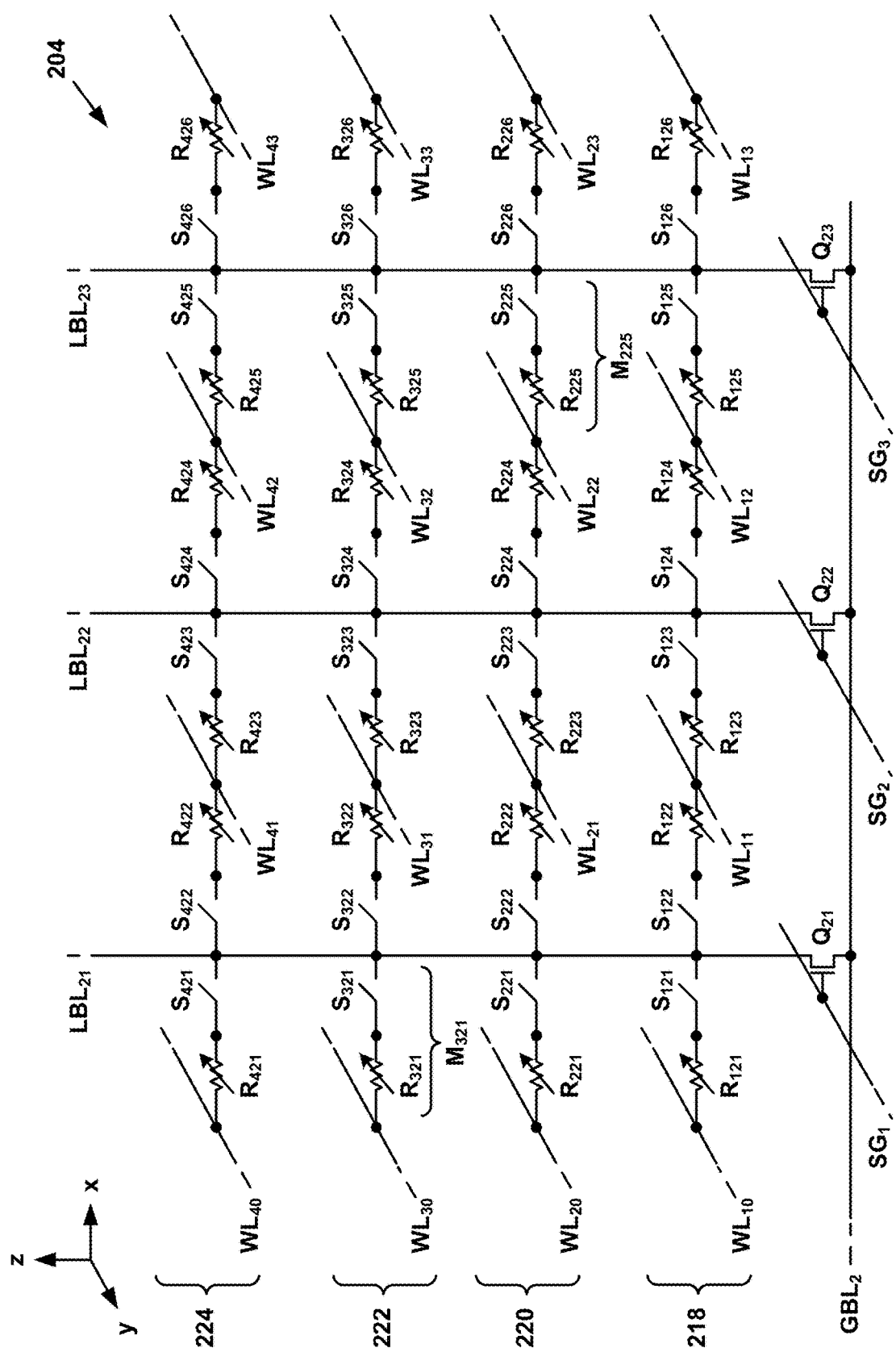
FIG. 2C2

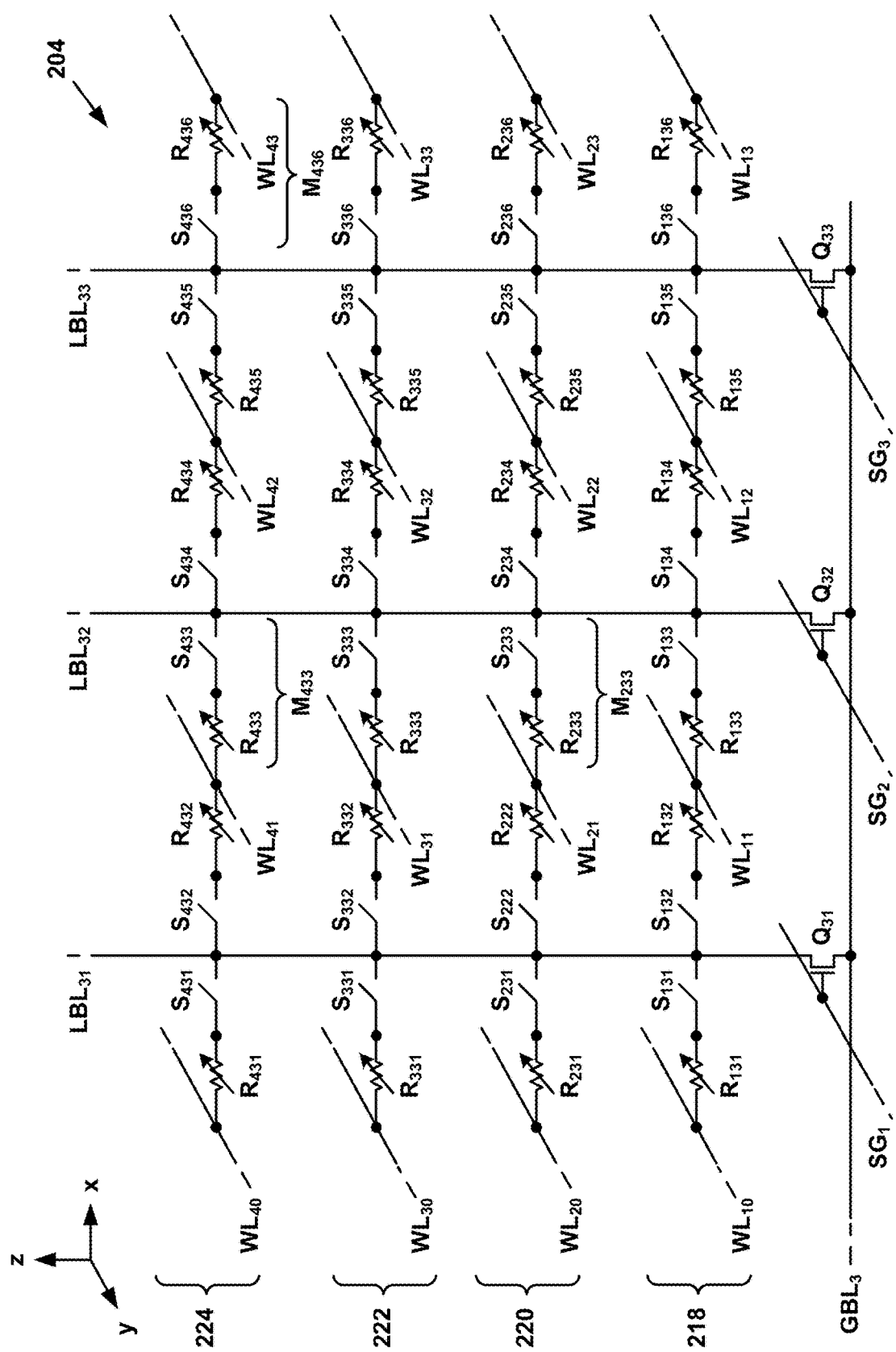
FIG. 2C3

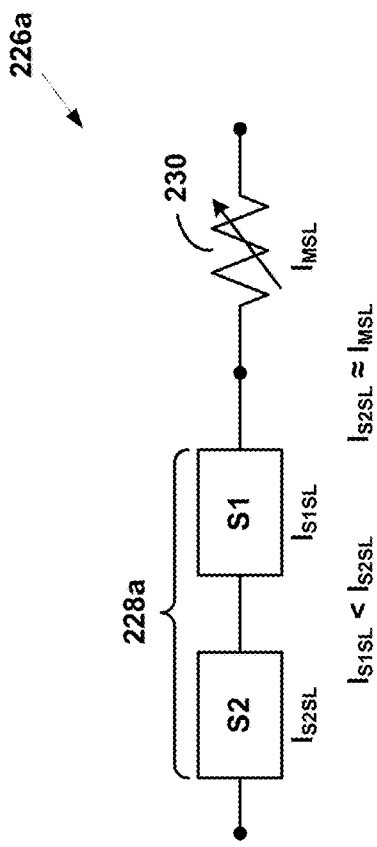
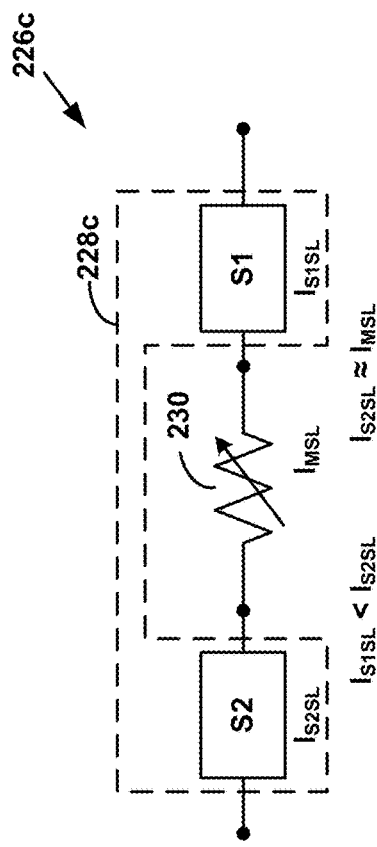
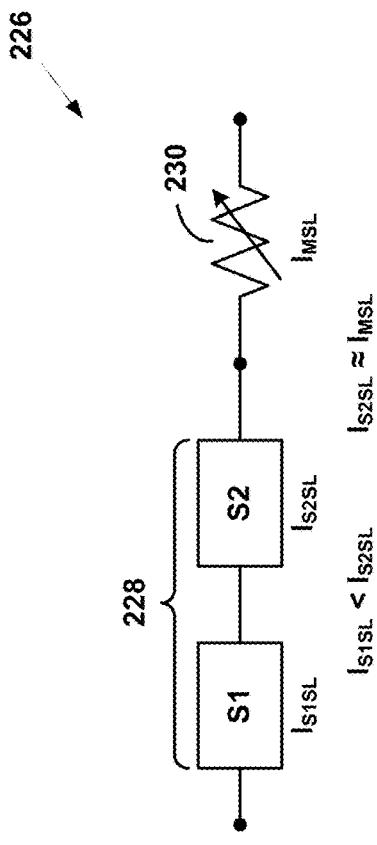
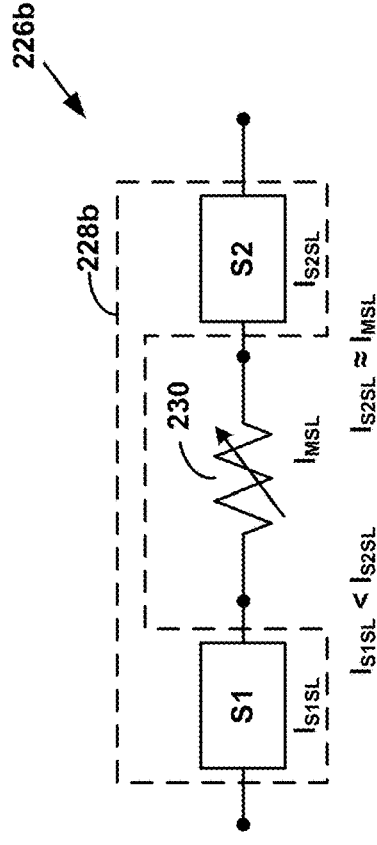
FIG. 2D
FIG. 2E
FIG. 2F
FIG. 2G

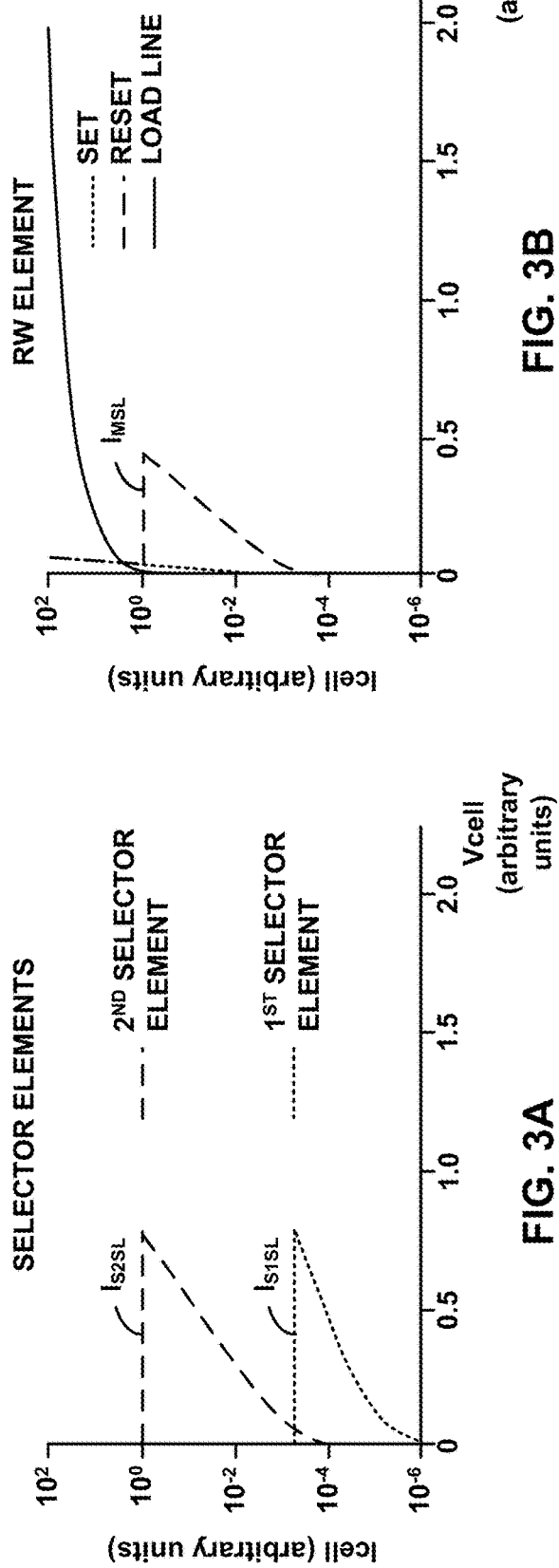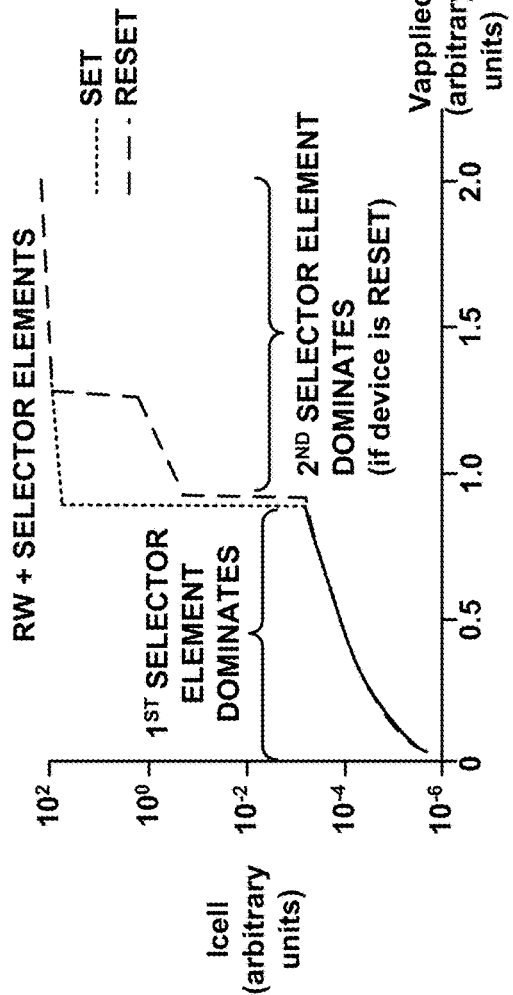

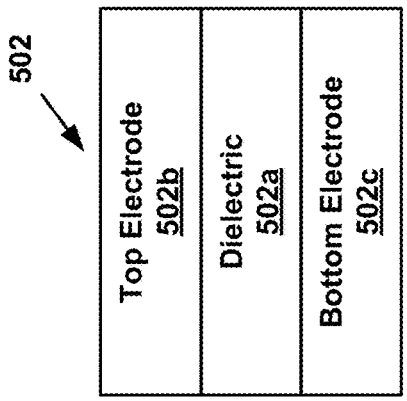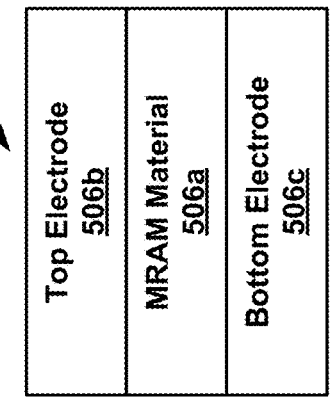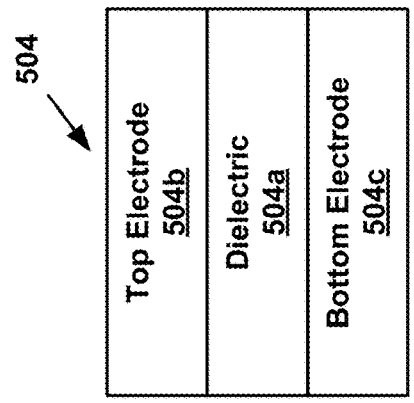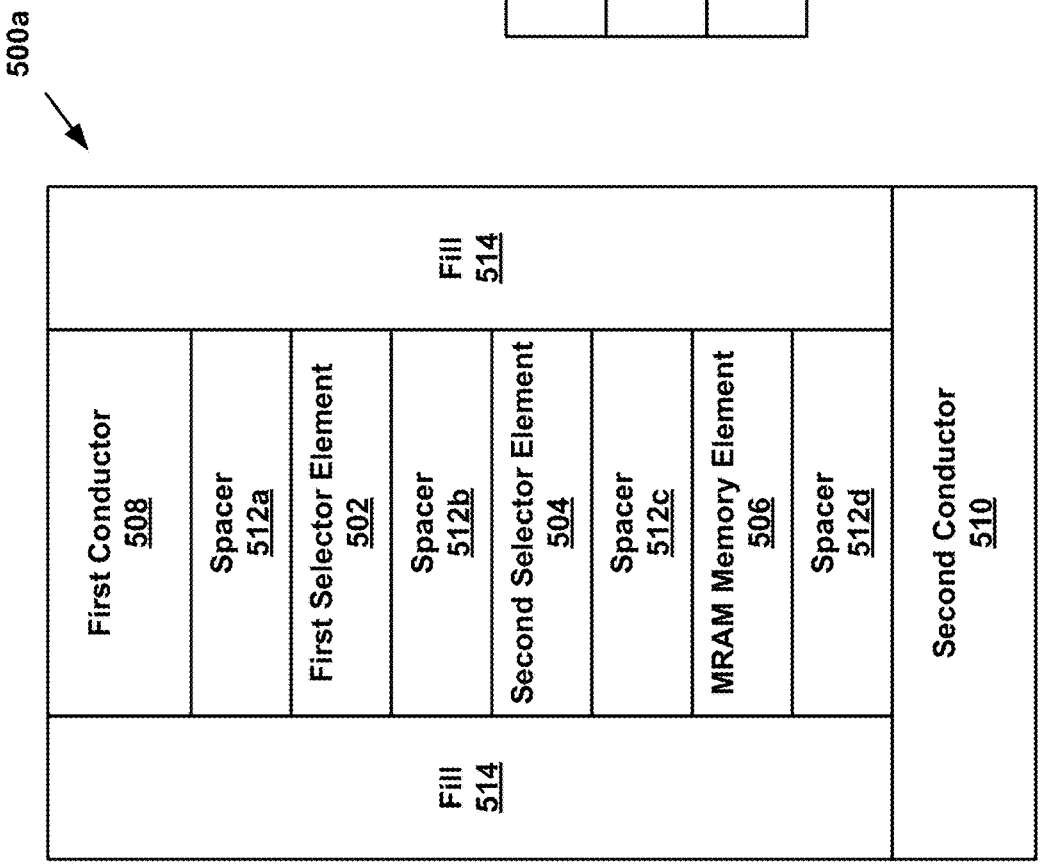

METHODS AND APPARATUS FOR THREE-DIMENSIONAL NON-VOLATILE MEMORY

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a power source.

One example of non-volatile memory uses non-volatile memory cells that include reversible resistance-switching memory elements that may be reversibly switched between a high resistance state and a low resistance state. The memory cells may be individually connected between first and second conductors (e.g., a bit line electrode and a word line electrode). The state of such a memory cell is typically changed by proper voltages being placed on the first and second conductors.

In recent years, non-volatile memory devices have been scaled to reduce the cost per bit. However, as process geometries shrink, many design and process challenges are presented.

BRIEF DESCRIPTION OF THE DRAWINGS

FIGS. 2C1-2C3 depict an embodiment of a portion of a monolithic three-dimensional memory array.

FIGS. 2D-2G depict embodiments of a non-volatile memory cell.

FIG. 3A depicts a diagram of an example current versus voltage characteristic for example selector elements.

FIG. 3B a diagram of an example current versus voltage characteristic for an example reversible resistance-switching memory element.

FIG. 3C depicts an example current-voltage characteristic of a non-volatile memory cell that includes the selector elements of FIG. 3A and the memory element of FIG. 3B.

FIG. 5A depicts an embodiment of a memory cell including a first selector element, a second selector element and a reversible resistance-switching memory element.

FIG. 5B depicts an embodiment of a first selector element of FIG. 5A.

FIG. 5C depicts an embodiment of a second selector element of FIG. 5A.

FIG. 5D depicts an embodiment of a reversible resistance-switching memory element of FIG. 5A.

DETAILED DESCRIPTION

Figure 1A:
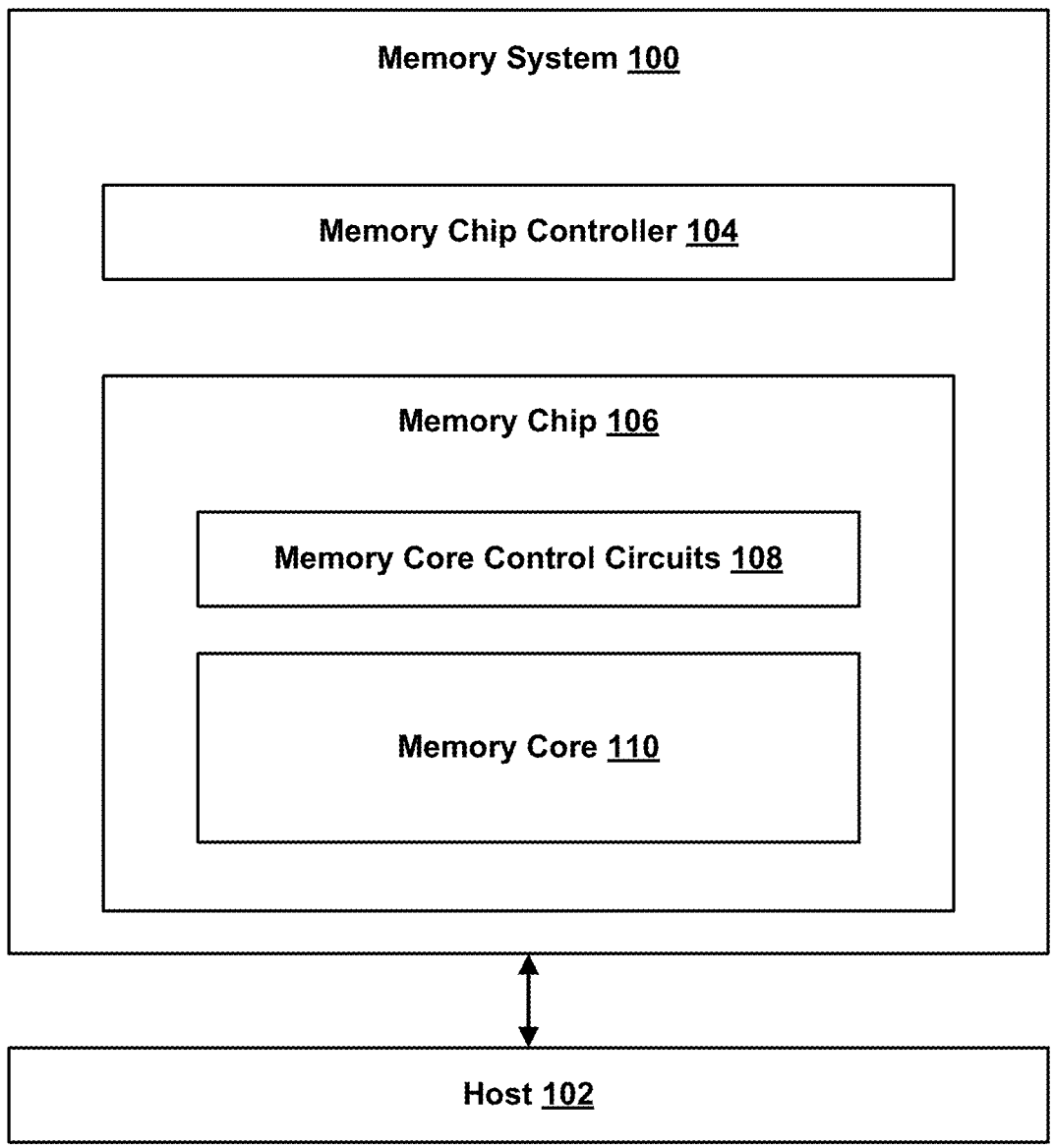
FIG. 1A depicts an embodiment of a memory system and a host.

Technology is described for including isolation elements in a non-volatile memory cell, such as a reversible resistance-switching memory cell. The non-volatile memory cell is disposed between a word line and a bit line. The non-volatile memory cell includes a reversible resistance-switching memory element coupled in series with an isolation element. An isolation element is an electronic device that may be reversibly switched ON (e.g., to allow current to flow through the reversible resistance-switching memory element) and OFF (e.g., to prevent current from flowing through the reversible resistance-switching memory element).

In an embodiment, the isolation element includes a first selector element coupled in series with a second selector element. A selector element is an electronic device that may be reversibly switched between a low resistance state (e.g., to allow current to flow through the reversible resistance-switching memory element), and a high resistance state (e.g., to prevent current from flowing through the reversible resistance-switching memory element).

In embodiments, the first selector element and the second selector element each may be any of an ovonic threshold switch, a correlated electron switch, a volatile conductive bridge, a mixed-ionic-electronic-conduction selector, an amorphous PCM switch, or other similar device. In an embodiment, the first selector element and the second selector element may be the same type of selector element. In other embodiments, the first selector element and the second selector element may be different from one another.

In an embodiment, the first selector element and the second selector element are each responsible for a different part of the current-voltage characteristic of the non-volatile memory cell.

In an embodiment, the first selector element is a lower leakage selector element, and the second selector element is a higher leakage selector element matched to the leakage of the reversible resistance-switching memory element.

In an embodiment, the first selector element has a threshold voltage similar to the threshold voltage of the second selector element, but larger than a half-select voltage of the non-volatile memory cell.

In another embodiment, the first selector element is a lower leakage selector element, and the second selector element is a higher leakage selector element. The second selector element has a slower switching time than a switching time of the first selector element. As used herein a selector element "switching time" is a time required for a selector element to transition from a high resistance state to a low resistance state.

In another embodiment, the first selector element has low leakage in a high resistance state and a negligible voltage drop across the first selector element in a low resistance state. The second selector element has higher leakage in the high resistance state, but in the low resistance state has a voltage drop across the second selector element that is comparable to the threshold voltage of the second selector element.

In another embodiment, a capacitor is disposed between the isolation element and the reversible resistance-switching memory element. Without wanting to be bound by any particular theory, it is believed that the capacitor absorbs snapback current from the bit and word lines and discharges it over longer time scales. As used herein, "snapback" refers to capacitive discharge currents that result when a selector element turns ON (e.g., transitions from a high resistance state to a low resistance state). In an embodiment, the isolation element includes a first selector element. In another embodiment, the isolation element includes a first selector element coupled in series with a second selector element. In another embodiment, a resistor may be included between the first selector element and the reversible resistance-switching memory element.

In some embodiments, a memory array may include a cross-point memory array. A cross-point memory array may refer to a memory array in which two-terminal non-volatile memory cells are placed at the intersections of a first set of control lines (e.g., word lines) arranged in a first direction and a second set of control lines (e.g., bit lines) arranged in a second direction perpendicular to the first direction. The two-terminal non-volatile memory cells may include a reversible resistance-switching memory element, disposed between first and second conductors. Examples of reversible resistance-switching memory elements include a phase change material, a magnetic tunnel junction, a ferroelectric material, a metal oxide (e.g., hafnium oxide), a barrier modulated switching structure, carbon nanotubes, or other similar reversible resistance-switching memory elements. Phase change material-based memory devices are commonly referred to as phase change memory (PCM). Magnetic tunnel junction-based memory devices are commonly referred to as magnetic random-access memory (MRAM). Resistive-switching memory element based memory devices are commonly abbreviated as RRAM or ReRAM.

In some embodiments, each non-volatile memory cell in a cross-point memory array includes a reversible resistance-switching memory element in series with an isolation element, such as one or more diodes, ovonic threshold switches, correlated electron switches, volatile conductive bridges, mixed-ionic-electronic-conduction selectors, amorphous PCM switches, to reduce leakage currents. In other cross-point memory arrays, the non-volatile memory cells do not include such isolation elements.

In an embodiment, a non-volatile storage system may include one or more two-dimensional arrays of non-volatile memory cells. The non-volatile memory cells within a two-dimensional memory array may form a single layer of non-volatile memory cells and may be selected via control lines (e.g., word lines and bit lines) in the X and Y directions. In another embodiment, a non-volatile storage system may include one or more monolithic three-dimensional memory arrays in which two or more layers of non-volatile memory cells may be formed above a single substrate without any intervening substrates.

In some cases, a three-dimensional memory array may include one or more vertical columns of non-volatile memory cells located above and orthogonal to a substrate. In an example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each non-volatile memory cell includes a reversible resistance-switching memory element and an isolation element in series with the reversible resistance-switching memory element.

In some embodiments, a non-volatile storage system may include a non-volatile memory that is monolithically formed in one or more physical levels of arrays of non-volatile memory cells having an active area disposed above a silicon substrate. The non-volatile storage system may also include circuitry associated with the operation of the non-volatile memory cells (e.g., decoders, state machines, page registers, and/or control circuitry for controlling reading, programming and erasing of the non-volatile memory cells). The circuitry associated with the operation of the non-volatile memory cells may be located above the substrate or within the substrate.

In some embodiments, a non-volatile storage system may include a monolithic three-dimensional memory array. The monolithic three-dimensional memory array may include one or more levels of non-volatile memory cells. Each non-volatile memory cell within a first level of the one or more levels of non-volatile memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102.

Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of non-volatile memory cells or one or more three-dimensional arrays of non-volatile memory cells. In an embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In some embodiments, one or more managing or control circuits may be used for controlling the operation of a memory array. The one or more managing or control circuits may provide control signals to a memory array to perform an erase operation, a read operation, and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
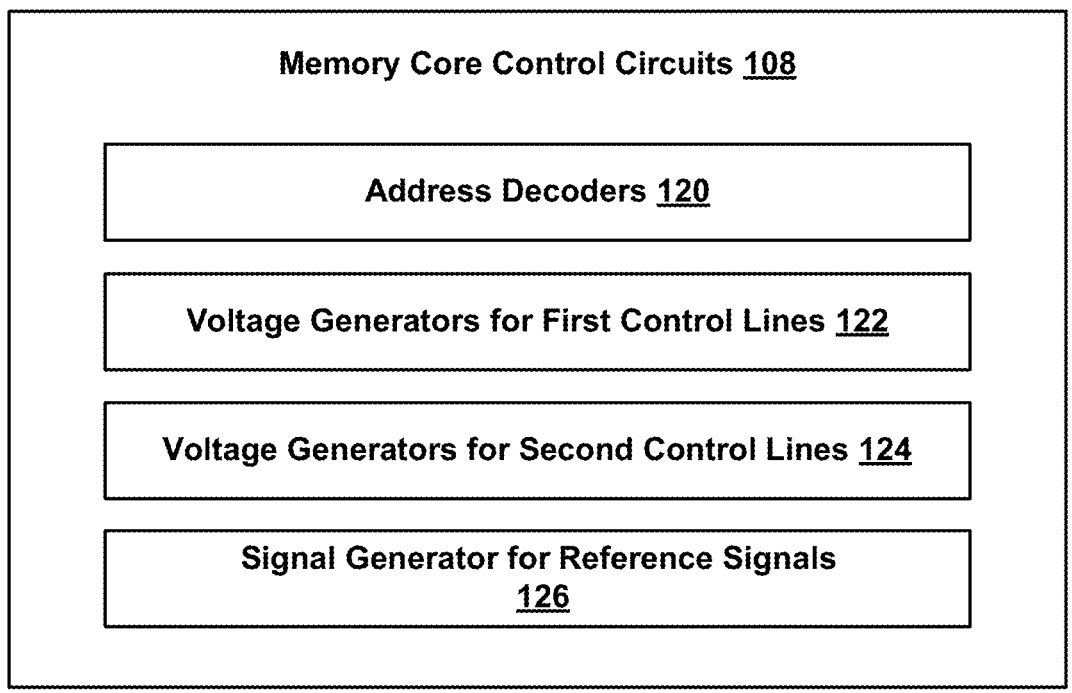
FIG. 1B depicts an embodiment of memory core control circuits.

FIG. 1B depicts one embodiment of memory core control circuits 108. As depicted, memory core control circuits 108 include address decoders 120, voltage generators for first control lines 122, voltage generators for second control lines 124 and signal generators for reference signals 126 (described in more detail below). Control lines may include word lines, bit lines, or a combination of word lines and bit lines. First control lines may include first (e.g., selected) word lines and/or first (e.g., selected) bit lines that are used to place non-volatile memory cells into a first (e.g., selected) state. Second control lines may include second (e.g., unselected) word lines and/or second (e.g., unselected) bit lines that are used to place non-volatile memory cells into a second (e.g., unselected) state.

Address decoders 120 may generate memory block addresses, as well as row addresses and column addresses for a particular memory block. Voltage generators (or voltage regulators) for first control lines 122 may include one or more voltage generators for generating first (e.g., selected) control line voltages. Voltage generators for second control lines 124 may include one or more voltage generators for generating second (e.g., unselected) control line voltages. Signal generators for reference signals 126 may include one or more voltage and/or current generators for generating reference voltage and/or current signals. The drive circuitry can operate to supply a desired current or a desired voltage. Furthermore the desired current and voltage can be controlled to vary with time during the application of a read and write programming sequence.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of non-volatile memory cells, other organizations or groupings also can be used with the technology described herein.

Figure 1C:
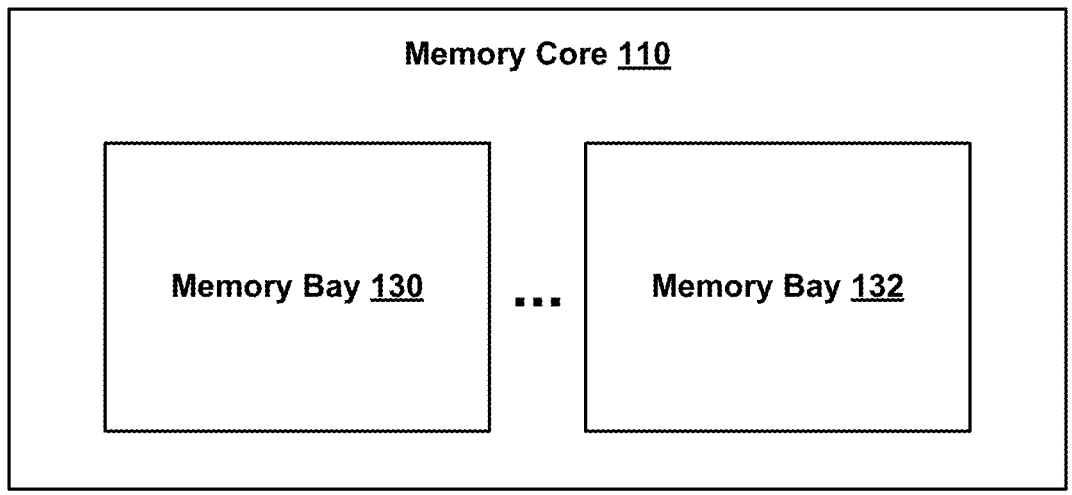
FIG. 1C depicts an embodiment of a memory core.

FIG. 1C depicts an embodiment of memory core 110 of FIG. 1A. As depicted, memory core 110 includes memory bay 130 and memory bay 132. In some embodiments, the number of memory bays per memory core can differ for different implementations. For example, a memory core may include only a single memory bay or multiple memory bays (e.g., 16 or other number of memory bays).

Figure 1D:
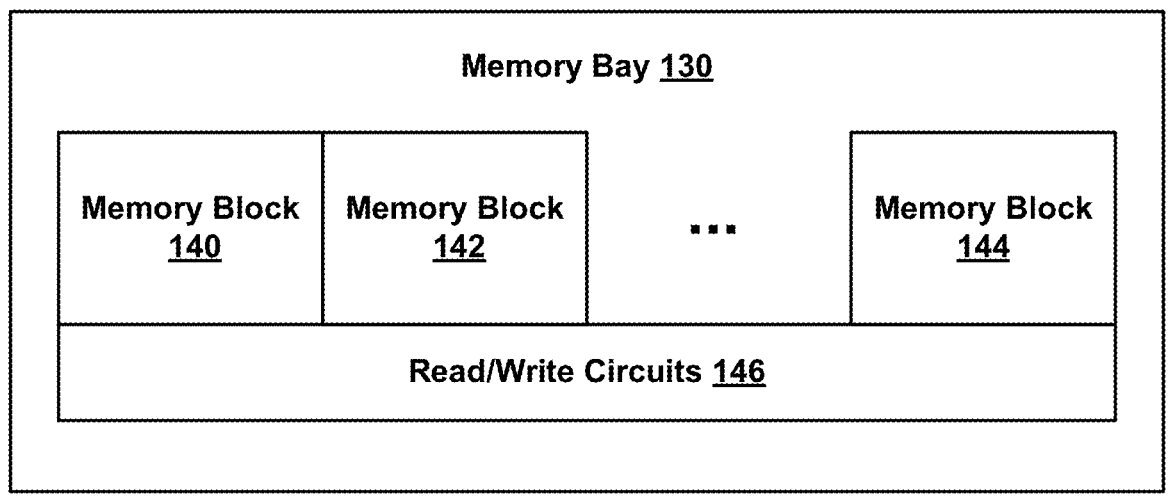
FIG. 1D depicts an embodiment of a memory bay.

FIG. 1D depicts an embodiment of memory bay 130 in FIG. 1C. As depicted, memory bay 130 includes memory blocks 140-144 and read/write circuits 146. In some embodiments, the number of memory blocks per memory bay may differ for different implementations. For example, a memory bay may include one or more memory blocks (e.g., 32 or other number of memory blocks per memory bay). Read/write circuits 146 include circuitry for reading and writing non-volatile memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The non-volatile memory cells within memory blocks 140-144 may permit direct over-writing of pages (i.e., data representing a page or a portion of a page may be written into memory blocks 140-144 without requiring an erase or reset operation to be performed on the non-volatile memory cells prior to writing the data).

In one example, memory system 100 of FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular non-volatile memory cell to be in one of three or more data/resistance states (i.e., the particular non-volatile memory cell may include a multi-level non-volatile memory cell). In one example, read/write circuits 146 may apply a first voltage difference (e.g., 2V) across the particular non-volatile memory cell to program the particular non-volatile memory cell into a first state of the three or more data/resistance states or a second voltage difference (e.g., 1V) across the particular non-volatile memory cell that is less than the first voltage difference to program the particular non-volatile memory cell into a second state of the three or more data/resistance states.

As described above, in an embodiment, each non-volatile memory cell includes a reversible resistance-switching memory element coupled in series with an isolation element. In such an embodiment, the voltages required to program multilevel states can be above the threshold voltage of the reversible resistance-switching memory element and isolation element combination. However, the write voltages across the reversible resistance-switching memory element also can be lower than voltage required to turn ON the reversible resistance-switching memory element and isolation element combination. In this latter scenario, the isolation element and array properties can be such that the excess applied voltage is dissipated by both the isolation element turn on voltage drop and the additional voltage drops in the array and drive circuitry when current is flowing. The programming of non-volatile memory cells can either be accomplished through application of a desired voltage or current sequence.

Applying a smaller voltage difference across the particular non-volatile memory cell may cause the particular non-volatile memory cell to be partially programmed or programmed at a slower rate than when applying a larger voltage difference. In another example, read/write circuits 146 may apply a first voltage difference across the particular non-volatile memory cell for a first time period to program the particular non-volatile memory cell into a first state of the three or more data/resistance states, and apply the first voltage difference across the particular non-volatile memory cell for a second time period less than the first time period. One or more programming pulses followed by a non-volatile memory cell verification phase may be used to program the particular non-volatile memory cell to be in the correct state.

Figure 1E:
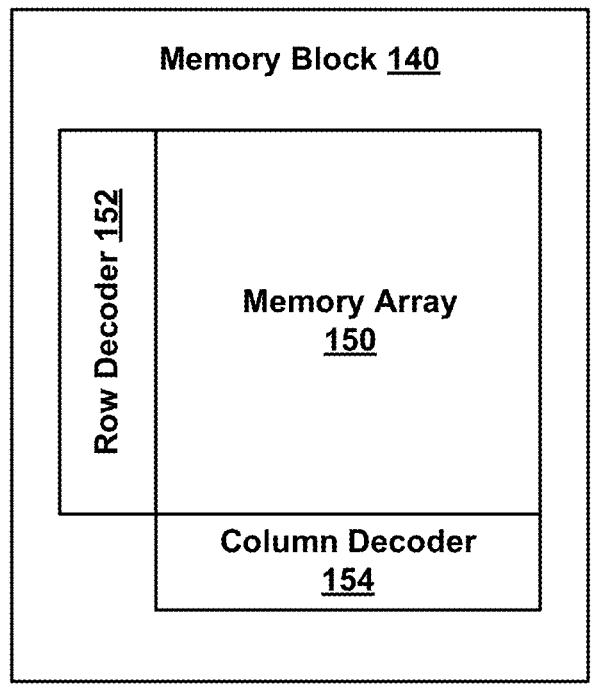
FIG. 1E depicts an embodiment of a memory block.

FIG. 1E depicts an embodiment of memory block 140 in FIG. 1D. As depicted, memory block 140 includes a memory array 150, row decoder 152, and column decoder 154. Memory array 150 may include a contiguous group of non-volatile memory cells having contiguous word lines and bit lines. Memory array 150 may include one or more layers of non-volatile memory cells. Memory array 150 may include a two-dimensional memory array or a three-dimensional memory array.

Row decoder 152 decodes a row address and selects a particular word line in memory array 150 when appropriate (e.g., when reading or writing non-volatile memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16M non-volatile memory cells. In embodiments, memory block 140 may include one or more memory arrays 150.

Figure 1F:
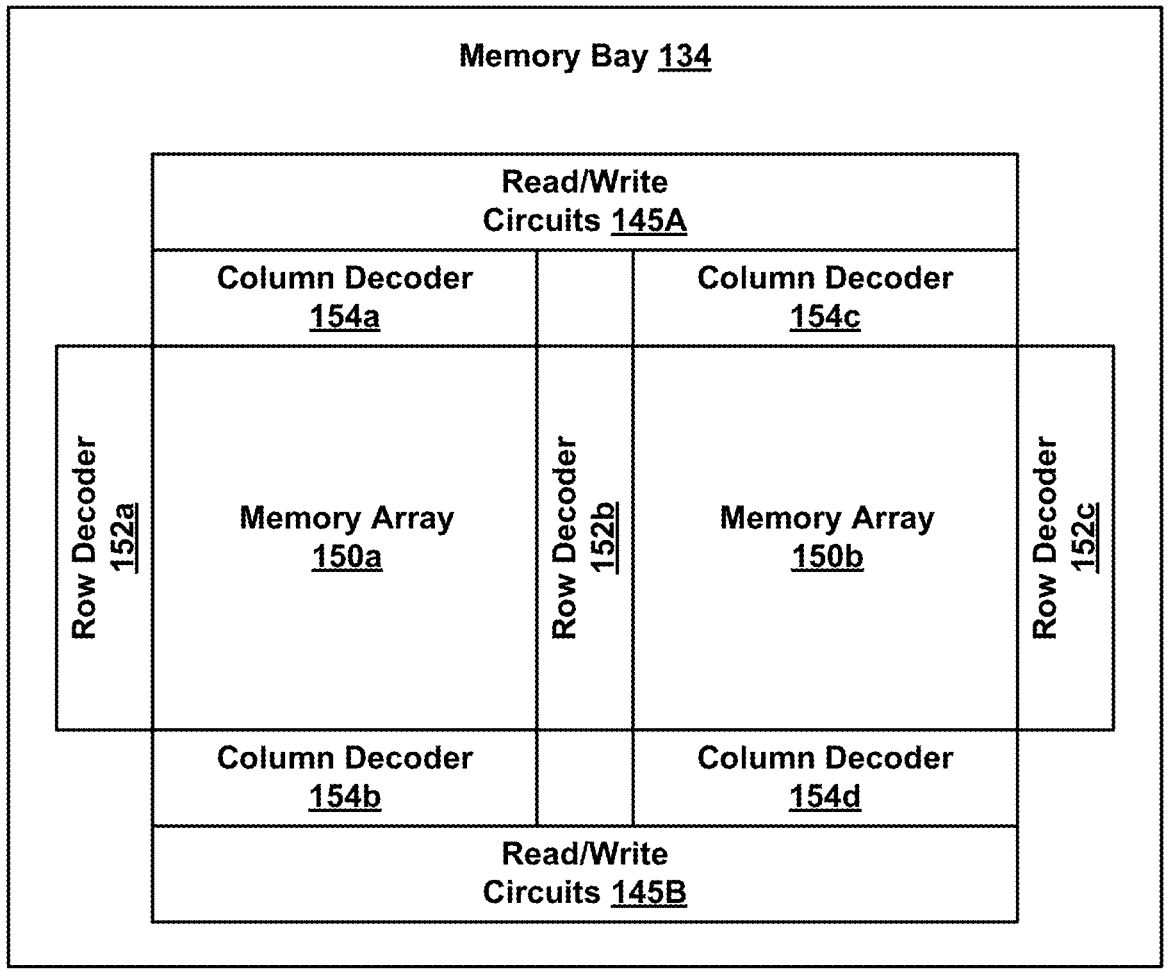
FIG. 1F depicts another embodiment of a memory bay.

FIG. 1F depicts an embodiment of a memory bay 134. Memory bay 134 is an alternative example implementation for memory bay 130 of FIG. 1D. In some embodiments, row decoders, column decoders, and read/write circuits may be split or shared between memory arrays. As depicted, row decoder 152b is shared between memory arrays 150a and 150b because row decoder 152b controls word lines in both memory arrays 150a and 150b (i.e., the word lines driven by row decoder 152b are shared).

Row decoders 152a and 152b may be split such that even word lines in memory array 150a are driven by row decoder 152a and odd word lines in memory array 150a are driven by row decoder 152b. Row decoders 152c and 152b may be split such that even word lines in memory array 150b are driven by row decoder 152c and odd word lines in memory array 150b are driven by row decoder 152b.

Column decoders 154a and 154b may be split such that even bit lines in memory array 150a are controlled by column decoder 154b and odd bit lines in memory array 150a are driven by column decoder 154a. Column decoders 154c and 154d may be split such that even bit lines in memory array 150b are controlled by column decoder 154d and odd bit lines in memory array 150b are driven by column decoder 154c.

The selected bit lines controlled by column decoder 154a and column decoder 154c may be electrically coupled to read/write circuits 146a. The selected bit lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

Figure 1G:
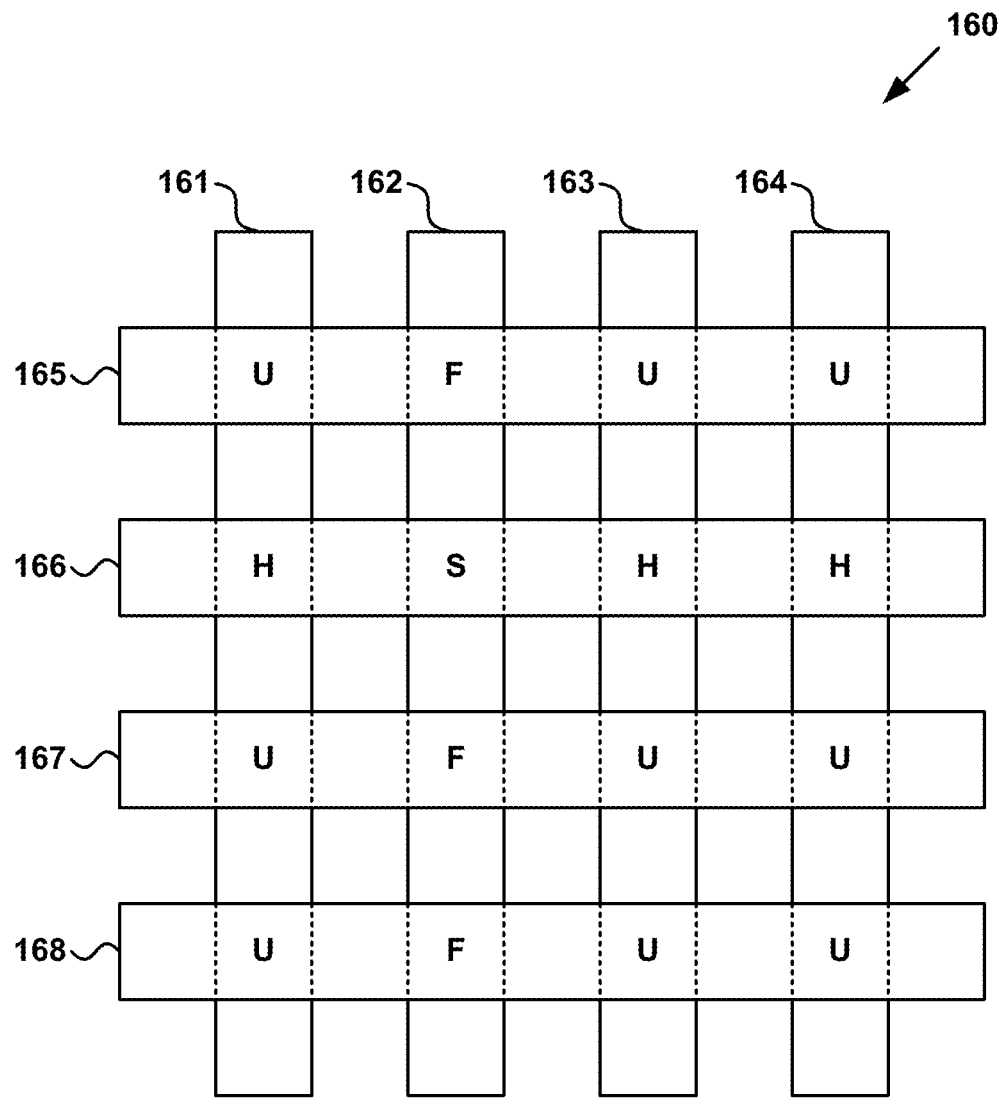
FIG. 1G depicts an embodiment of a cross-point memory array.

FIG. 1G depicts an embodiment of a cross-point memory array 160. In one example, cross-point memory array 160 may correspond with memory array 150 of FIG. 1E. As depicted, cross-point memory array 160 includes word lines 165-168 and bit lines 161-164. Bit lines 161 may include vertical bit lines or horizontal bit lines. Word line 166 is a selected word line and bit line 162 is a selected bit line. At the intersection of selected word line 166 and selected bit line 162 is a selected memory cell (an S cell). The voltage across an S cell is the difference between the selected word line voltage and the selected bit line voltage.

Memory cells at the intersections of selected word line 166 and unselected bit lines 161, 163, and 164 are unselected memory cells (H cells). H cells are unselected memory cells that share a selected word line that is biased to the selected word line voltage. The voltage across the H cells is the difference between the selected word line voltage and the unselected bit line voltage.

Memory cells at the intersections of selected bit line 162 and unselected word lines 165, 167, and 168 are unselected memory cells (F cells). F cells are unselected memory cells that share a selected bit line that is biased to a selected bit line voltage. The voltage across F cells is the difference between the unselected word line voltage and the selected bit line voltage. Cells H and F are also known as half-selected cells, and the voltage across each of cells H and F is commonly referred to as the "half-select voltage." Persons of ordinary skill in the art will understand that under normal operation conditions the half-select voltages for all H and F cells will be similar but not exactly the same. As such, as used herein the term "half-select voltage" represents an operationally relevant section of the distribution of half-selected voltages.

Memory cells at the intersections of unselected word lines 165, 167, and 168 and unselected bit lines 161, 163, and 164 are unselected memory cells (U cells). The voltage across U cells is the difference between the unselected word line voltage and the unselected bit line voltage.

Figure 2A:
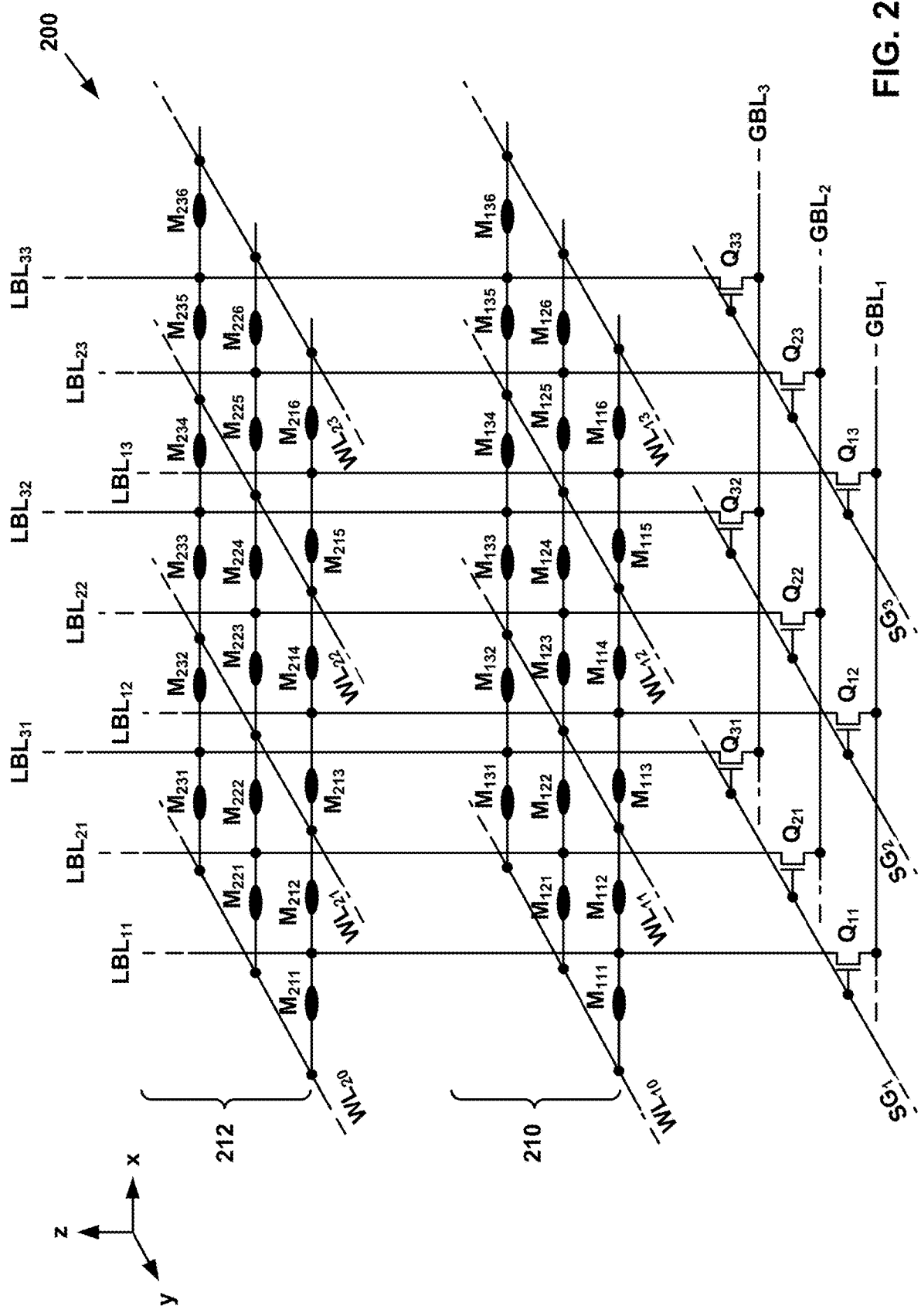
FIG. 2A depicts an embodiment of a portion of a monolithic three-dimensional memory array.

FIG. 2A depicts one embodiment of a portion of a monolithic three-dimensional memory array 200 that includes a first memory level 210, and a second memory level 212 positioned above first memory level 210. Memory array 200 is one example of an implementation for memory array 150 of FIG. 1E. Local bit lines $LBL_{11}$-$LBL_{33}$ are arranged in a first direction (e.g., a vertical or z-direction) and word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular non-volatile memory cell (e.g., non-volatile memory cell $M_{111}$ is disposed between local bit line $LBL_{11}$ and word line $WL_{10}$). The particular non-volatile memory cell may include a floating gate memory element, a charge trap memory element (e.g., using a silicon nitride material), a reversible resistance-switching memory element (e.g., PCM, MRAM, or ReRAM), or other similar device. The global bit lines $GBL_1$-$GBL_3$ are arranged in a third direction (e.g., a y-direction) that is perpendicular to both the first direction and the second direction.

Each local bit line $LBL_{11}$-$LBL_{33}$ has an associated bit line select transistor $Q_{11}$-$Q_{33}$, respectively. Bit line select transistors $Q_{11}$-$Q_{33}$ may be field effect transistors, such as shown, or may be any other transistors. As depicted, bit line select transistors $Q_{11}$-$Q_{31}$ are associated with local bit lines $LBL_{11}$-$LBL_{31}$, respectively, and may be used to connect local bit lines $LBL_{11}$-$LBL_{31}$ to global bit lines $GBL_1$-$GBL_3$, respectively, using row select line $SG_1$. In particular, each of bit line select transistors $Q_{11}$-$Q_{31}$ has a first terminal (e.g., a drain/source terminal) coupled to a corresponding one of local bit lines $LBL_{11}$-$LBL_{31}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_1$.

Similarly, bit line select transistors $Q_{12}$-$Q_{32}$ are associated with local bit lines $LBL_{12}$-$LBL_{32}$, respectively, and may be used to connect local bit lines $LBL_{12}$-$LBL_{32}$ to global bit lines $GBL_1$-$GBL_3$, respectively, using row select line $SG_2$. In particular, each of bit line select transistors $Q_{12}$-$Q_{32}$ has a first terminal (e.g., a drain/source terminal) coupled to a corresponding one of local bit lines $LBL_{12}$-$LBL_{32}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_2$.

Likewise, bit line select transistors $Q_{13}$-$Q_{33}$ are associated with local bit lines $LBL_{13}$-$LBL_{33}$, respectively, and may be used to connect local bit lines $LBL_{13}$-$LBL_{33}$ to global bit lines $GBL_1$-$GBL_3$, respectively, using row select line $SG_3$. In particular, each of bit line select transistors $Q_{13}$-$Q_{33}$ has a first terminal (e.g., a drain/source terminal) coupled to a corresponding one of local bit lines $LBL_{13}$-$LBL_{33}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_3$.

Although not shown in FIG. 2A, each of word lines $WL_{10}$-$WL_{23}$ may have an associated word line select transistor that may be used to connect word lines $WL_{10}$-$WL_{23}$ to global word lines using column select lines.

Because a single bit line select transistor is associated with a corresponding local bit line, the voltage of a particular global bit line may be applied to a corresponding local bit line. Therefore, when a first set of local bit lines (e.g., $LBL_{11}$-$LBL_{31}$) is biased to global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated.

In an embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation. A similar set of operations is performed to word lines $WL_{10}$-$WL_{23}$ and global word lines to select a single device.

In an embodiment, a vertical bit line memory array, such as memory array 200, includes a greater number of non-volatile memory cells along the word lines as compared with the number of non-volatile memory cells along the vertical bit lines (e.g., the number of non-volatile memory cells along a word line may be more than 10 times the number of non-volatile memory cells along a bit line). In one example, the number of non-volatile memory cells along each bit line may be 16 or 32, whereas the number of non-volatile memory cells along each word line may be 2048 or more than 4096. Other numbers of non-volatile memory cells along each bit line and along each word line may be used.

In an embodiment of a read operation, the data stored in a selected non-volatile memory cell (e.g., non-volatile memory cell $M_{111}$) may be read by biasing the word line connected to the selected non-volatile memory cell (e.g., selected word line $WL_{10}$) to a selected word line voltage in read mode (e.g., 0V). The local bit line (e.g., $LBL_{11}$) coupled to the selected non-volatile memory cell ($M_{111}$) is biased to a selected bit line voltage in read mode (e.g., 1 V) via the associated bit line select transistor (e.g., $Q_{11}$) coupled to the selected local bit line ($LBL_{11}$), and the global bit line (e.g., $GBL_1$) coupled to the bit line select transistor ($Q_{11}$). A sense amplifier may then be coupled to the selected local bit line ($LBL_{11}$) to determine a read current $I_{READ}$ of the selected non-volatile memory cell ($M_{111}$). The read current $I_{READ}$ is conducted by the bit line select transistor $Q_{11}$, and may be between about 100 nA and about 10 μA, although other read currents may be used.

In an embodiment of a write operation, data may be written to a selected non-volatile memory cell (e.g., non-volatile memory cell $M_{221}$) by biasing the word line connected to the selected non-volatile memory cell (e.g., $WL_{20}$)

to a selected word line voltage in write mode (e.g., 5V). The local bit line (e.g., $LBL_{21}$) coupled to the selected non-volatile memory cell ($M_{221}$) is biased to a selected bit line voltage in write mode (e.g., 0 V) via the associated bit line select transistor (e.g., $Q_{21}$) coupled to the selected local bit line ($LBL_{21}$), and the global bit line (e.g., $GBL_2$) coupled to the bit line select transistor ($Q_{21}$). During a write operation, a programming current $I_{PGRM}$ is conducted by the associated bit line select transistor $Q_{21}$, and may be between about 1 uA and about 100 uA, although other programming currents may be used.

Figure 2B:
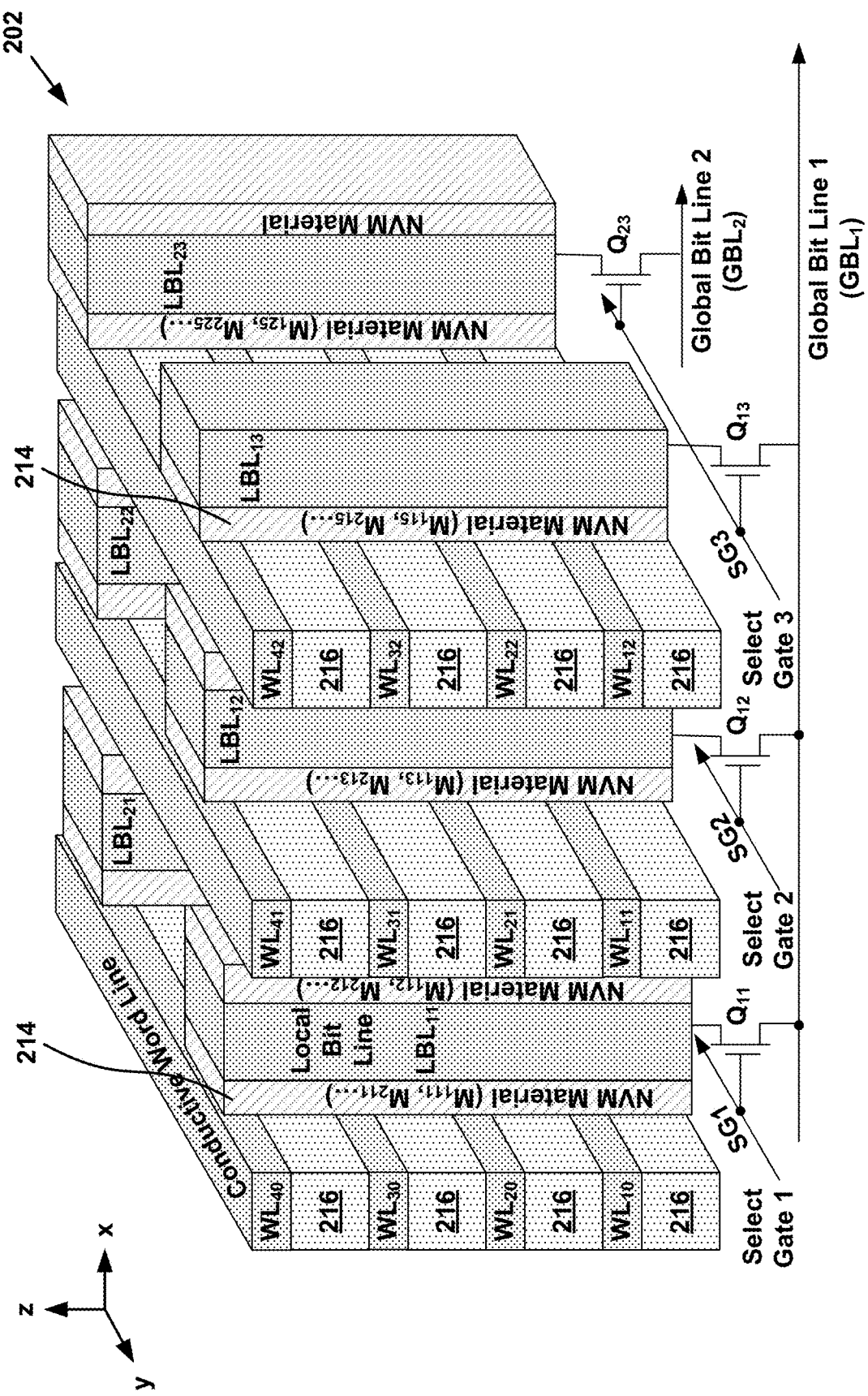
FIG. 2B depicts an embodiment of a portion of a monolithic three-dimensional memory array that includes a non-volatile memory material.

FIG. 2B depicts an embodiment of a portion of a monolithic three-dimensional memory array 202 that includes a non-volatile memory material. The portion of monolithic three-dimensional memory array 202 depicted in FIG. 2B may include an implementation for a portion of the monolithic three-dimensional memory array 200 depicted in FIG. 2A.

Monolithic three-dimensional memory array 202 includes word lines $WL_{10}$, $WL_{11}$, $WL_{12}$, . . . , $WL_{42}$ that are formed in a first direction (e.g., an x-direction), vertical bit lines $LBL_{11}$, $LBL_{12}$, $LBL_{13}$, . . . , $LBL_{33}$ that are formed in a second direction perpendicular to the first direction (e.g., a z-direction), and non-volatile memory material 214 formed in the second direction (e.g., the z-direction). A spacer 216 made of a dielectric material (e.g., silicon dioxide, silicon nitride, or other dielectric material) is disposed between adjacent word lines $WL_{10}$, $WL_{11}$, $WL_{12}$, . . . , $WL_{42}$.

Non-volatile memory material 214 may include, for example, an oxide material, a reversible resistance-switching memory material (e.g., one or more metal oxide layers such as nickel oxide, hafnium oxide, or other similar metal oxide materials, a phase change material, a barrier modulated switching structure or other similar reversible resistance-switching memory material), a ferroelectric material, MRAM cell, or a charge trapping material (e.g., a layer of silicon nitride). In an embodiment, non-volatile memory material 214 may include a single continuous layer of material that may be used by a plurality of non-volatile memory cells or devices.

In an embodiment, portions of non-volatile memory material 214 may include a part of a first non-volatile memory cell associated with the cross section between $WL_{12}$ and $LBL_{13}$ and a part of a second non-volatile memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure).

As depicted, each of the vertical bit lines $LBL_{11}$, $LBL_{12}$, $LBL_{13}$, . . . , $LBL_{33}$ may be connected to one of a set of global bit lines via an associated vertically-oriented bit line select transistor (e.g., $Q_{11}$, $Q_{12}$, $Q_{13}$, $Q_{23}$). Each vertically-oriented bit line select transistor may include a MOS device (e.g., an NMOS device) or a vertical thin-film transistor (TFT).

In an embodiment, each vertically-oriented bit line select transistor is a vertically-oriented pillar-shaped TFT coupled between an associated local bit line pillar and a global bit line. In an embodiment, the vertically-oriented bit line select transistors are formed in a pillar select layer formed above a CMOS substrate, and a memory layer that includes multiple layers of word lines and memory elements is formed above the pillar select layer.

FIGS. 2C1-2C3 depict an embodiment of a portion of a monolithic three-dimensional memory array 204 that includes a first memory level 218, a second memory level 220 positioned above first memory level 218, a third memory level 222 positioned above second memory level 220, and a fourth memory level 224 positioned above third memory level 222. Memory array 204 is one example of an implementation for memory array 150 of FIG. 1E.

As depicted, disposed between the intersection of each local bit line and each word line is a particular non-volatile memory cell. For example, non-volatile memory cell $M_{111}$ is disposed between local bit line $LBL_{11}$ and word line $WL_{10}$, non-volatile memory cell $M_{225}$ is disposed between local bit line $LBL_{23}$ and word line $WL_{22}$, and non-volatile memory cell $M_{433}$ is disposed between local bit line $LBL_{32}$ and word line $WL_{41}$.

In an embodiment, each non-volatile memory cell includes an isolation element coupled in series with an associated reversible resistance-switching memory element. For example, non-volatile memory cell $M_{414}$ includes isolation element $S_{414}$ coupled in series with associated reversible resistance-switching memory element $R_{414}$, non-volatile memory cell $M_{321}$ includes isolation element $S_{321}$ coupled in series with associated reversible resistance-switching memory element $R_{321}$, and non-volatile memory cell $M_{233}$ includes isolation element $S_{233}$ coupled in series with associated reversible resistance-switching memory element $R_{233}$.

In an embodiment, each of reversible resistance-switching memory elements $R_{111}$-$R_{436}$ includes a non-volatile memory material, for example, an oxide material, a reversible resistance-switching memory material (e.g., one or more metal oxide layers such as nickel oxide, hafnium oxide, or other similar metal oxide materials, a phase change material, a barrier modulated switching structure or other similar reversible resistance-switching memory material), a ferroelectric material, or a charge trapping material (e.g., a layer of silicon nitride).

In an embodiment, each of isolation elements $S_{111}$-$S_{436}$ includes a single selector element, such as a diode, an ovonic threshold switch, a correlated electron switch, mixed-ionic-electronic-conduction switch, a volatile conductive bridge, or an amorphous PCM switch. In another embodiment, each of isolation elements $S_{111}$-$S_{436}$ includes more than one selector element.

Isolation elements that include a single selector element have two disadvantages. A first disadvantage is that such isolation elements may be unable to simultaneously satisfy ultralow leakage requirements for selectors while simultaneously meeting sub-threshold leakage requirements that maximize memory windows. This issue arises in ovonic threshold switches (OTS) paired with PCM, and limits array sizes and memory windows that can be achieved.

When using PCM with an OTS selector element in a demarcated read scheme, the leakage at the threshold voltage of the OTS and PCM, respectively, should be substantially equal to maximize the memory window of the memory element. The requirement to match leakage runs contrary to the goal of using OTS as selector element, in which the leakage is negligible at half select, which can be close to the threshold voltage. As a result, either the chip architecture either needs to provision for higher leakage through larger write transistors, lower read SNR, or smaller array sizes or the architecture needs to use smaller array sizes, which reduces layout efficiency.

A second disadvantage is snapback current, which is a capacitive discharge current that results when fast selector elements turn ON. Snapback causes read-disturb in which the state of the memory element can be inadvertently changed during reading. Snapback occurs due to rapid discharge of capacitive charge built up when a selector element changes from the HIGH to LOW resistance states. The capacitive discharge currents are proportional to the difference between the voltage drop across the selector element before and after the selector element switches from the HIGH to LOW resistance states, as well as the capacitive environment of the cell. The peak capacitive current will depend on the time duration of the HIGH to LOW resistance state transition, with longer transitions leading to smaller snapback currents.

The technology described herein seeks to overcome both disadvantages.

FIG. 2D depicts an embodiment of a non-volatile memory cell 226 that includes an isolation element 228 coupled in series with an associated reversible resistance-switching memory element 230. Non-volatile memory cell 226 is an example of one of memory cells $M_{111}$-$M_{436}$, isolation element 228 is an example of one of isolation elements $S_{111}$-$S_{436}$, and reversible resistance-switching memory element 230 is an example of one of reversible resistance-switching memory elements $R_{111}$-$R_{436}$, all of FIGS. 2C1-2C3.

In the embodiment of FIG. 2D, isolation element 228 includes a first selector element S1 and a second selector element S2. In embodiments, first selector element S1 and second selector element S2 each may be any of an ovonic threshold switch, a correlated electron switch, a volatile conductive bridge, a mixed-ionic-electronic-conduction selector, an amorphous PCM switch, or other similar device. In an embodiment, first selector element S1 and second selector element S2 may be the same type of selector element. In other embodiments, first selector element S1 and second selector element S2 may be different from one another.

As described below, in an embodiment, first selector element S1 and second selector element S2 are tailored for use with a PCM associated reversible resistance-switching memory element 230. Without wanting to be bound by any particular theory, it is believed that such an embodiment may achieve low leakage current and high read margin. In another embodiment, first selector element S1 and second selector element S2 are tailored for use with an MRAM or ReRAM associated reversible resistance-switching memory element 230. Without wanting to be bound by any particular theory, it is believed that such an embodiment may reduce snapback.

FIGS. 2E-2G depict various embodiments of non-volatile memory cells 226a-226, respectively, that include an isolation element 228a-228c, respectively, coupled in series with an associated reversible resistance-switching memory element 230. Non-volatile memory cells 226a-226c are examples of one of memory cells $M_{111}$-$M_{436}$, isolation elements 228a-228c are examples of one of isolation elements $S_{111}$-$S_{436}$, and reversible resistance-switching memory element 230 is an example of one of reversible resistance-switching memory elements $R_{111}$-$R_{436}$, all of FIGS. 2C1-2C3.

In particular, FIG. 2E depicts an embodiment of a non-volatile memory cell 226a that includes an isolation element 228a coupled in series with associated reversible resistance-switching memory element 230, FIG. 2F depicts an embodiment of a non-volatile memory cell 226b that includes an isolation element 228b coupled in series with associated reversible resistance-switching memory element 230, and FIG. 2G depicts an embodiment of a non-volatile memory cell 226c that includes an isolation element 228c coupled in series with associated reversible resistance-switching memory element 230.

PCM+Selector Elements

In an embodiment, each non-volatile memory cell 226 includes a first selector element S1, a second selector element S2 and an associated PCM memory element 230. First sector element S1 has a first selector leakage current (e.g., first selector sub-threshold leakage current $I_{S1SL}$), and second selector element S2 has a second selector leakage current (e.g., second selector sub-threshold leakage current $I_{S2SL}$). As used herein, a "selector sub-threshold leakage current" is a current conducted by a selector element in a high resistance state at the threshold voltage of the selector element (e.g., the voltage at which the selector element transitions from OFF to ON), before the selector switches to the low resistance state. Persons of ordinary skill in the art will understand that the order of first sector element S1 and second selector element S2 may be reversed.

In an embodiment, the associated PCM memory element 230 has a memory element leakage current (e.g., memory element sub-threshold leakage current $I_{MSL}$). As used herein, a "memory element sub-threshold leakage current" is a current conducted by a reversible resistance-switching memory element at the threshold voltage of the reversible resistance-switching memory element (e.g., the voltage at which the reversible resistance-switching memory element turns ON while in the high resistance state (RESET)). For memory devices that operate with multilevel resistance or threshold voltage states, $I_{MSL}$ can be taken to be the median sub-threshold voltage of the different memory states that have a threshold voltage.

Typically, the thresholding event by itself will not be sufficient to change the memory element state from a high resistance state (RESET), which has a threshold voltage, to a low resistance state (SET) that does not have a threshold voltage, or to another memory state with a different threshold voltage. For a two-state PCM memory device, the memory state can be changed from RESET to SET by applying a sufficiently high write voltage pulse, larger than the threshold voltage, to heat up the cell to or above the crystallization temperature of the phase change material, and then tailoring the duration of the voltage fall time to achieve a well-crystallized material. To change the state from a SET state to RESET state, the write voltage pulse needs to be large enough to disturb or melt the crystal structure of the PCM memory element, with a voltage fall time that is rapid enough to prevent recrystallization.

In an embodiment, first selector leakage current $I_{S1SL}$ is less than second selector leakage current $I_{S2SL}$, and second selector leakage current $I_{S2SL}$ substantially equals (e.g., within 50%) memory element leakage current $I_{MSL}$ of the associated PCM memory element 230. The actual values of sub-threshold leakage currents depend on cell design, and can be between about 10 nA and about 10 uA, although other values may be used.

First selector element S1 has a first threshold voltage Vth1, and second selector element S2 has a second threshold voltage Vth2. In an embodiment, first threshold voltage Vth1 is approximately equal to the second threshold voltage Vth2, but is greater than a half-select voltage Vhs of non-volatile memory cell 226. As used herein, the half-select voltage Vhs of non-volatile memory cell 226 is one half the voltage applied to a selected memory cell during a program operation (e.g., a write voltage or a read voltage). In another embodiment, first threshold voltage Vth1 and second threshold voltage Vth2 have the following relationship:

$$\frac{Vth2}{2} \leq Vth1 \leq 1.25 \times Vth2$$

For example, FIG. 3A depicts example current-versus voltage characteristics for first selector element S1 and second selector element S2, and FIG. 3B depicts an example current-versus voltage characteristic for the associated PCM memory element 230. First selector element S1 has first selector leakage current $I_{MSL}$, second selector element S2 has second selector leakage current $I_{S2SL}$, first selector leakage current $I_{S1SL}$ is less than second selector leakage current $I_{S2SL}$, and second selector leakage current $I_{S2SL}$ substantially equals memory element leakage current $I_{MSL}$ of the associated PCM memory element 230.

Without wanting to be bound by any particular theory, it is believed that the current-versus voltage characteristic of a non-volatile memory cell may be tailored by using a first selector element S1 and a second selector element S2 with different selector leakage currents ($I_{S1SL}$ and $I_{S2SL}$, respectively) and threshold voltages (Vth1 and Vth2, respectively) from one another. In particular, without wanting to be bound by any particular theory, it is believed that the selector element (S1, S2) with the lowest leakage current at a given voltage will experience the largest voltage drop, and hence will dominate the current-versus voltage characteristic of the non-volatile memory cell.

For example, FIG. 3C depicts an example current-versus voltage characteristic for a non-volatile memory cell 226 that includes first selector element S1 and second selector element S2 having the example current-versus voltage characteristics of FIG. 3A coupled in series with the associated PCM memory element 230 having the example current-versus voltage characteristic of FIG. 3B. For voltages up to about 1.0 a.u., first selector element S1 (which has a first selector leakage current $I_{S1SL}$ less than second selector leakage current $I_{S2SL}$) dominates the current-versus voltage characteristic.

For voltages greater than about 1.0 a.u., first selector element S1 turns ON. If the phase change material is in the SET state, then the turn ON of S1 will trigger the turn ON of S2 and high current will flow through the device, limited by external resistances and current limiter. If the phase change material is in the RESET state, then the additional voltage above about 1.0 au will need to be applied to turn ON both S2 and the RESET PCM. In this regime, the leakage current that S2 limits is larger but better matched to the RESET PCM at the respective threshold voltages. As a result, without wanting to be bound by any particular theory, it is believed that the non-volatile memory cell 226 including first selector element S1 and second selector element S2 will exhibit a good (low) leakage and a high read margin (difference between the SET and RESET currents at the read voltage).

In the example embodiments depicted in FIGS. 3A-3C, first selector leakage current $I_{S1SL}$ of first selector element S1 and second selector leakage current $I_{S2SL}$ of second selector element S2 and memory element leakage current $I_{MSL}$ of the associated PCM memory element 230 are tailored to one another. Without wanting to be bound by any particular theory, it is believed that material selection of first selector element S1 and second selector element S2 may be used to tailor first selector leakage current $I_{S1SL}$ of first selector element S1 and second selector leakage current $I_{S2SL}$ of second selector element S2.

Figure 4B:
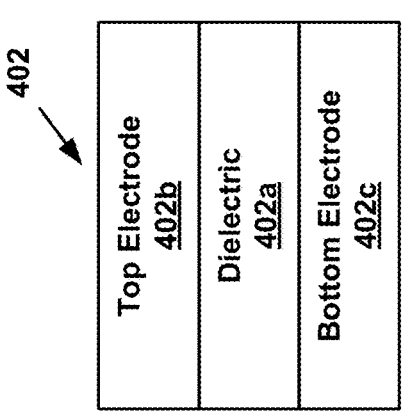
FIG. 4B depicts an embodiment of a first selector element of FIG. 4A.
Figure 4D:
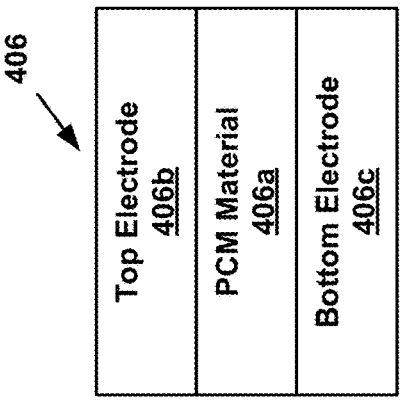
FIG. 4D depicts an embodiment of a reversible resistance-switching memory element of FIG. 4A.
Figure 4C:
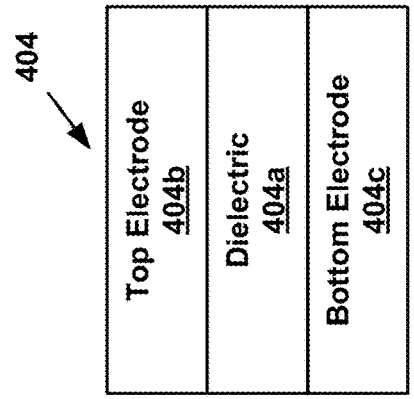
FIG. 4C depicts an embodiment of a second selector element of FIG. 4A.
Figure 4A:
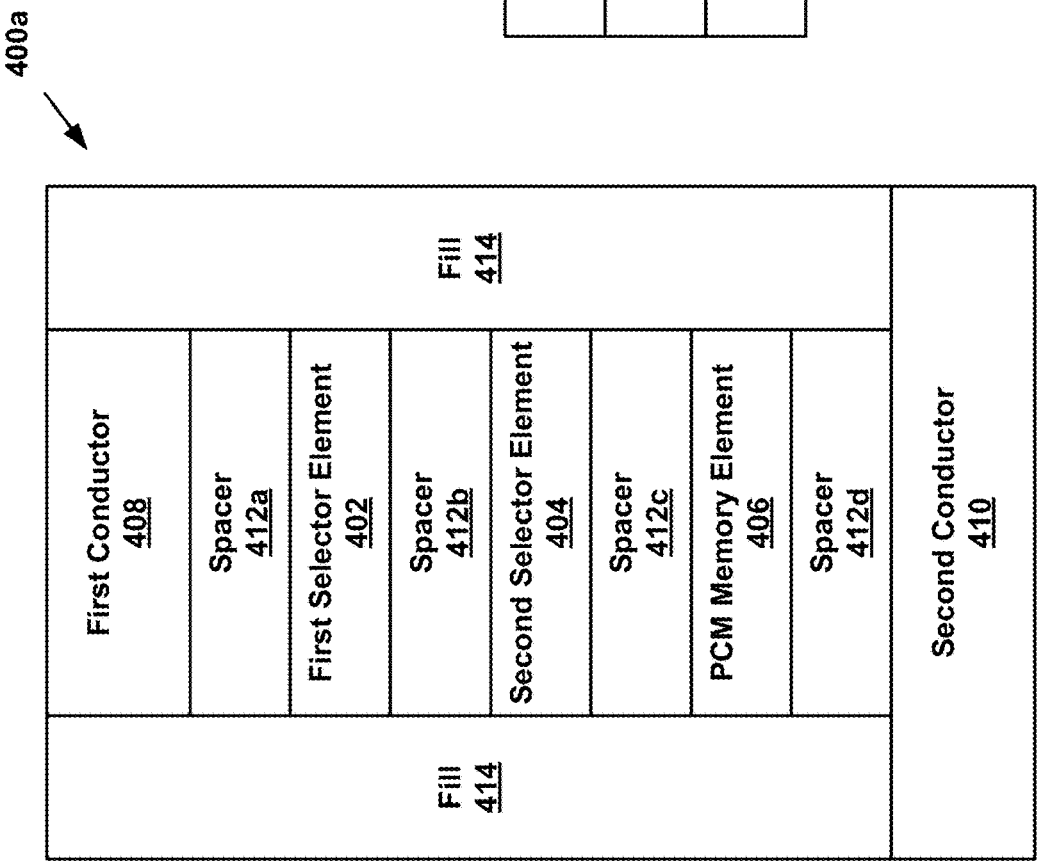
FIG. 4A depicts an embodiment of a memory cell including a first selector element, a second selector element and a reversible resistance-switching memory element.

For example, FIG. 4A depicts an example memory cell 400a that includes a first selector element 402, a second selector element 404, and an associated PCM memory element 406, all coupled in series between a first conductor 408 (e.g., a bit line) (e.g., tungsten) and a second conductor 410 (e.g., a word line) (e.g., tungsten). In an embodiment, a conductive spacer 412a is disposed between first selector element 402 and first conductor 408, a conductive spacer 412b is disposed between first selector element 402 and second selector element 404, a conductive spacer 412c is disposed between second selector element 404 and PCM memory element 406, and a conductive spacer 412d is disposed between PCM memory element 406 and second conductor 410. In some embodiments, one or more of conductive spacers 412a-412d may be omitted. In some embodiments the relative positions of first selector element 402, second selector element 404, and memory element 406 may be interchanged.

In an embodiment, dielectric fill 414 (e.g., silicon dioxide) is disposed on either side of first conductor 408, conductive spacers 412a-412d, first selector element 402, second selector element 404 and PCM memory element 406. In embodiments, conductive spacers 412a-412d may be between about 0.5 nm and about 30 nm of tungsten, tungsten nitride, titanium, titanium nitride, tantalum, tantalum nitride, ruthenium, rhodium, or amorphous carbon, although other conductive materials and/or thicknesses may be used. In other embodiments conductive spacers 412a-412d may be non-metallic and consist of compounds such Si, Ge, $SiO_2$, $GeO_2$, $SnO_2$, SiN, or MgO, with thickness ranging from about 0.5 nm to about 5 nm.

FIG. 4B depicts an example first selector element 402, which includes a first dielectric material 402a disposed between a top electrode 402b and a bottom electrode 402c. FIG. 4C depicts an example second selector element 404, which includes a second dielectric material 404a disposed between a top electrode 404b and a bottom electrode 404c. FIG. 4D depicts an example PCM memory element 406 which includes a PCM material 406a disposed between a top electrode 406b and a bottom electrode 406c. In embodiments, top electrodes 402b, 404b, 406b and bottom electrodes 402c, 404c, 406c each may be between about 1 nm and about 50 nm of tungsten, titanium nitride, or other similar conductive material, although other conductive materials and/or thicknesses may be used.

In an embodiment, first selector element 402 has a first selector leakage current (e.g., first selector sub-threshold leakage current $I_{S1SL}$ of FIG. 3A), second selector element 404 has a second selector leakage current (e.g., second selector sub-threshold leakage current $I_{S2SL}$ of FIG. 3A), first selector leakage current $I_{S1SL}$ is less than second selector leakage current $I_{S2SL}$, and second selector leakage current $I_{S2SL}$ substantially equals a memory element leakage current (e.g., memory element sub-threshold leakage current $I_{MSL}$ of FIG. 3B) of the associated PCM memory element 406.

As described above, material selection of first selector element 402 and second selector element 404 may be used to tailor first selector leakage current $I_{S1SL}$ of first selector element 402 and second selector leakage current $I_{S2SL}$ of second selector element 404 so that $I_{S1SL} < I_{S2SL}$, and $I_{S2SL} \approx I_{MSL}$. Following are example configurations and materials for first selector element 402 and second selector element 404 each configured as ovonic threshold switches:

| First Selector Element 402<br>First Dielectric Material 402a | Second Selector Element 404<br>Second Dielectric Material 404a |
|---|---|
| $Ge_xAs_y[ST]_z$, where ST = Se, Te, or a combination of Se and Te, x + y + z = 100, x < 20, 0.1 x z < y < 70. | $Ge_xAs_y[ST]_z$, where ST = Se, Te, or a combination of Se and Te, x + y + z = 100, x > 20, 0.1 x z < y < 70. |
| $Ge_xAs_y[ST]_z$, where ST = Se, x + y + z = 100, x = 5 – 20, and y ≈ z. | $Ge_xAs_y[ST]_z$, where ST = Se, x + y + z = 100, x = 30, and y ≈ z. |
| $Ge_xAs_ySe_zSi_w$ with trace nitrogen and/or carbon added, with x + y + z + w = 100, x < 20 and W~5 – 10. | $Ge_xAs_ySe_zSi_w$ with no nitrogen added, with x + y + z + w = 100, x > 10 and W~1 – 10. |
|  | $Si_xTe_y$, with 0.1 x y < x < y. |

In another embodiment, second selector element 404 is a correlated electronic switch, and second dielectric material 404a is NbOx or VOx. In another embodiment, second selector element 404 is a correlated electronic switch, and second dielectric material 404a is NbOx or Vox, doped with Cr, Ti, W, or Al.

In yet another embodiment, second selector element 404 is an amorphous PCM element, and second dielectric material 404a is $Ge_xSb_yTe_z$, with the composition and thickness of second dielectric material 404a selected so that the second threshold voltage Vth2 of second selector element 404 substantially matches (e.g., within 25%) the threshold voltage of the first selector element 402. The composition is further chosen so that second selector leakage current $I_{S2SL}$ substantially matches (e.g., within 50%) memory element leakage current $I_{MSL}$ of the associated reversible resistance-switching memory element 406. In this embodiment, top electrode 406b and bottom electrode 406c of reversible resistance-switching memory element 406 are chosen to inhibit the crystallization of the amorphous PCM selector.

In embodiments, first dielectric material 402a is between about 10 nm to about 50 nm, and may be tuned so that first threshold voltage Vth1 of first selector element 402 substantially matches (e.g., within 25%) second threshold voltage Vth2 of second selector element 404. In embodiments, second dielectric material 404a is between about 10 nm to about 50 nm, and may be tuned so that first threshold voltage Vth1 of first selector element 402 substantially matches (e.g., within 25%) second threshold voltage Vth2 of second selector element 404. In a further embodiment second selector element 404 is placed in close proximity to either first conductor 408 or second conductor 410 to enhance heat sinking for second selector element 404 to further inhibit second selector element 404 from crystallizing.

MRAM/ReRAM+Selector Elements

Referring again to FIG. 2D, in another embodiment, each non-volatile memory cell 226 includes a first selector element S1, a second selector element S2 and an associated MRAM/ReRAM memory element 230. First selector element S1 has a first selector leakage current $I_{S1SL}$ less than a predetermined maximum leakage current $Th_{MAX}$, and has a first switching time ts1, and second selector element S2 has a second selector leakage current $I_{S2SL}$ greater than first selector leakage current $I_{S1SL}$, and has a second switching time ts2 greater than first switching time ts1. In embodiments, second threshold voltage Vth2 of second selector element S2 substantially matches (e.g., within 40%) first threshold voltage Vth1 of first selector element S1.

For example, in an embodiment, maximum leakage current $IL_{MAX}$ is about 1 nA to about 100 nA, first switching time ts1 is less than about 1 ns, and second switching time ts2 is greater than about 1 ns. Without wanting to be bound by any particular theory, it is believed that first selector element S1 is optimized for low leakage current, and second selector element S2 is optimized to reduce peak snapback currents when second selector element S2 changes from the low to high resistance state.

In an embodiment, first selector element S1 and second selector element S2 are tailored to one another. Without wanting to be bound by any particular theory, it is believed that material selection of first selector element S1 and second selector element S2 may be used to tailor first selector element S1 so that first selector sub-threshold leakage current $I_{S1SL}$ is less than predetermined maximum leakage current $IL_{MAX}$ and is less than second selector sub-threshold leakage current $I_{S2SL}$, and first selector element S1 has a first switching time ts1, and second selector element S2 has a second switching time ts2 greater than first switching time ts1.

Figure 3D:
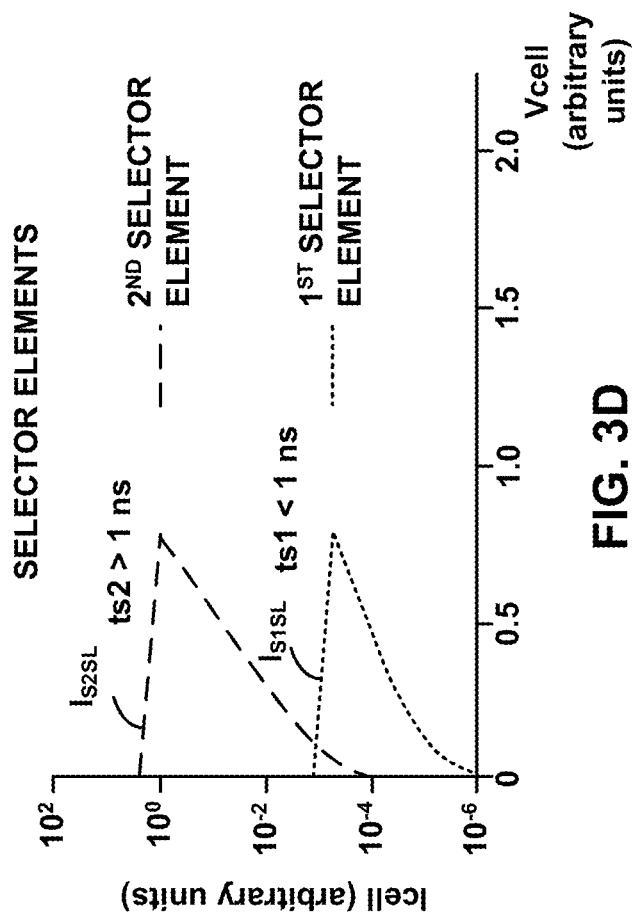
FIG. 3D depicts a diagram of another example current versus voltage characteristic for example selector elements.

For example, FIG. 3D depicts example current-versus voltage characteristics for first selector element S1 and second selector element S2. First selector element S1 has first selector leakage current $I_{S1SL}$ and a first switching time ts1, second selector element S2 has second selector leakage current $I_{S2SL}$ and second switching time ts2, first selector leakage current $I_{S1SL}$ is less than second selector leakage current $I_{S2SL}$ and less than predetermined maximum leakage current $IL_{MAX}$, and second switching time ts2 is greater than first switching time ts1.

FIG. 5A depicts an example memory cell 500a that includes a first selector element 502, a second selector element 504, and an associated MRAM memory element 506, all coupled in series between a first conductor 508 (e.g., a bit line) (e.g., tungsten) and a second conductor 510 (e.g., a word line) (e.g., tungsten). In an embodiment, a conductive spacer 512a is disposed between first selector element 502 and first conductor 508, a conductive spacer 512b is disposed between first selector element 502 and second selector element 504, a conductive spacer 512c is disposed between second selector element 504 and MRAM memory element 506, and a conductive spacer 512d is disposed between MRAM memory element 506 and second conductor 510. In some embodiments, one or more of conductive spacers 512a-512d may be omitted.

In an embodiment, dielectric fill 514 (e.g., silicon dioxide) is disposed on either side of first conductor 508, conductive spacers 512a-512d, first selector element 502, second selector element 504 and MRAM memory element 506. In embodiments, conductive spacers 512a-512d may be between 0.5 nm and about 30 nm of tungsten, tungsten nitride, titanium, titanium nitride, tantalum, tantalum nitride, ruthenium, rhodium, or amorphous carbon, although other conductive materials and/or thicknesses may be used. In other embodiments conductive spacers 512a-512d maybe non-metallic and consist of compounds such Si, Ge, $SiO_2$, $GeO_2$, $SnO_2$, SiN, or MgO, with thickness ranging from about 0.5 nm to about 5 nm.

FIG. 5B depicts an example first selector element 502, which includes a first dielectric material 502a disposed between a top electrode 502b and a bottom electrode 502c. FIG. 5C depicts an example second selector element 504, which includes a second dielectric material 504a disposed between a top electrode 504b and a bottom electrode 504c. FIG. 5D depicts an example MRAM memory element 506 which includes a MRAM material 506a disposed between a top electrode 506b and a bottom electrode 506c. In embodiments, top electrodes 502b, 504b, 506b and bottom electrodes 502c, 504c, 506c each may be between 0.5 nm and about 30 nm of tungsten, tungsten nitride, titanium, titanium nitride, tantalum, tantalum nitride, ruthenium, rhodium, or amorphous carbon, although other conductive materials and/or thicknesses may be used. In other embodiments top electrodes 502b, 504b, 506b and bottom electrodes 502c, 504c, 506c each may be non-metallic and consist of compounds such Si, Ge, $SiO_2$, $GeO_2$, $SnO_2$, SiN, or MgO, with thickness ranging from about 0.5 nm to about 5 nm.

In an embodiment, first selector element 502 has a first selector leakage current (e.g., first selector sub-threshold leakage current $I_{S1SL}$ of FIG. 3D), second selector element 504 has a second selector leakage current (e.g., second selector sub-threshold leakage current $I_{S2SL}$ of FIG. 3D), first selector leakage current $I_{S1SL}$ is less than second selector leakage current $I_{S2SL}$ and less than predetermined maximum leakage current $IL_{MAX}$, and first selector element 502 has a first switching time ts1, and second selector element 504 has a second switching time ts2 greater than first switching time ts1.

As described above, material selection of first selector element 502 and second selector element 504 may be used to tailor first selector leakage current $I_{S1SL}$ of first selector element 502 and second selector leakage current $I_{S2SL}$ of second selector element 504 so that $I_{S1SL} < I_{S2SL}$, $I_{S1SL} < IL_{MAX}$, and ts2>ts1.

In an embodiment, first selector element 502 has a first selector leakage current (e.g., first selector sub-threshold leakage current $I_{S1SL}$ of FIG. 3D), second selector element 504 has a second selector leakage current (e.g., second selector sub-threshold leakage current $I_{S2SL}$ of FIG. 3D), first selector leakage current $I_{S1SL}$ is less than second selector leakage current $I_{S2SL}$ and less than predetermined maximum leakage current $IL_{MAX}$. The threshold voltage of second selector element 504 is substantially similar to first selector element 502 (e.g., within about 40%). Second selector element 504 is chosen so that the voltage drop across second selector element 504 in the low resistance state is substantially similar to second threshold voltage Vth2 of second selector element 504 (e.g., within about 40%) in the low resistance state. In an embodiment, first selector element 502 and second selector element 504 are each correlated electronic switches, and first dielectric material 502a and second dielectric material 504a each are NbOx or VCrTiOx.

In another embodiment, first selector element 502 and second selector element 504 are each volatile conductive bridges, first dielectric material 502a and second dielectric material 504a each are $SiO_2$, $HfO_2$, $TaO_2$, SiTe, or other similar materials, top electrodes 502b, 504b and bottom electrodes 502b, 504c are copper, platinum, tungsten, aluminum, or other similar material.

In embodiments, first dielectric material 502a and second dielectric material 504a are each between about 10 nm to about 30 nm, and may be tuned so that first threshold voltage Vth1 of first selector element 502 substantially matches (e.g., within about 40%) second threshold voltage Vth2 of second selector element 504.

Capacitor+Selector Elements

Figure 6B:
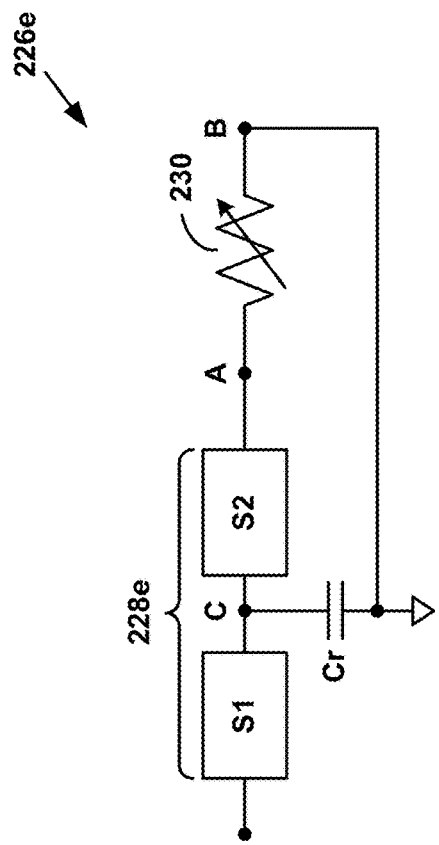
FIGS. 6A-6B depict embodiments of a non-volatile memory cell.
Figure 6A:
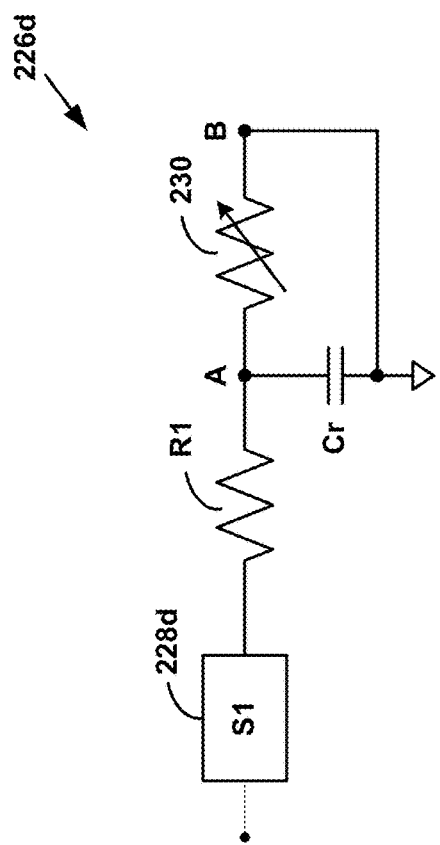

FIG. 6A depicts an embodiment of a non-volatile memory cell 226d that includes an isolation element 228d coupled in series with a resistor R1 and an associated reversible resistance-switching memory element 230, and a capacitor Cr disposed between the isolation element 228d and the associated reversible resistance-switching memory element 230. Non-volatile memory cell 226d is an example of one of memory cells $M_{111}$-$M_{436}$, isolation element 228d is an example of one of isolation elements $S_{111}$-$S_{436}$, and reversible resistance-switching memory element 230 is an example of one of reversible resistance-switching memory elements R111-R436, all of FIGS. 2C1-2C3.

Isolation element 228d includes a first selector element S1. Resistor R1 is disposed between isolation element 228d and the associated reversible resistance-switching memory element 230. Reversible resistance-switching memory element 230 has a first terminal at a first node A and a second terminal at a second node B. Capacitor Cr has a first terminal coupled to first node A disposed between resistor R1 and the associated reversible resistance-switching memory element 230, and a second terminal coupled to second node B.

In an embodiment, non-volatile memory cell 226d is disposed between an associated bit line (e.g., one of local bit lines $LBL_{11}$-$LBL_{33}$ of FIGS. 2C1-2C3) and an associated word line (e.g., one of word lines $WL_{10}$-$WL_{43}$ of FIGS. 2C1-2C3), and capacitor Cr is selected to have a value that substantially matches an effective parasitic capacitance of the associated bit line and the associated word line (e.g., between about 10-100% of the parasitic capacitance). For example, capacitor Cr may be between about 10 aF and about 10 fF, although other values may be used. Resistor R1 has a value selected to set a discharge time of capacitor Cr. In embodiments, resistor R1 may be between about 100 Ohms and about 10 kOhms, although other values may be used.

Without wanting to be bound by any particular theory, it is believed that capacitor Cr may absorb snapback current from the associated bit line and word line and discharge it over longer time scales than without capacitor Cr.

FIG. 6B depicts an embodiment of a non-volatile memory cell 226e that includes an isolation element 228e coupled in series with an associated reversible resistance-switching memory element 230, and a capacitor Cr disposed between the isolation element 228e and the associated reversible resistance-switching memory element 230. Non-volatile memory cell 226e is an example of one of memory cells $M_{111}$-$M_{436}$, isolation element 228e is an example of one of isolation elements $S_{111}$-$S_{436}$, and reversible resistance-switching memory element 230 is an example of one of reversible resistance-switching memory elements $R_{111}$-$R_{436}$, all of FIGS. 2C1-2C3.

Isolation element 228e includes a first selector element S1 and a second isolation element S2, and capacitor Cr has a first terminal coupled to a third node C disposed between first selector element S1 and second selector element S2, and a second terminal coupled to second node B. Capacitor Cr is selected to have a value that substantially matches an effective parasitic capacitance of the associated bit line and the associated word line near the non-volatile memory cell (e.g., between 10-100% of the parasitic capacitance). For example, capacitor Cr may be between about 10 aF and about 10 fF, although other values may be used.

Without wanting to be bound by any particular theory, it is believed that capacitor Cr may absorb snapback current from the associated bit line and word line and discharge it over longer time scales than without capacitor Cr.

Figure 7A:
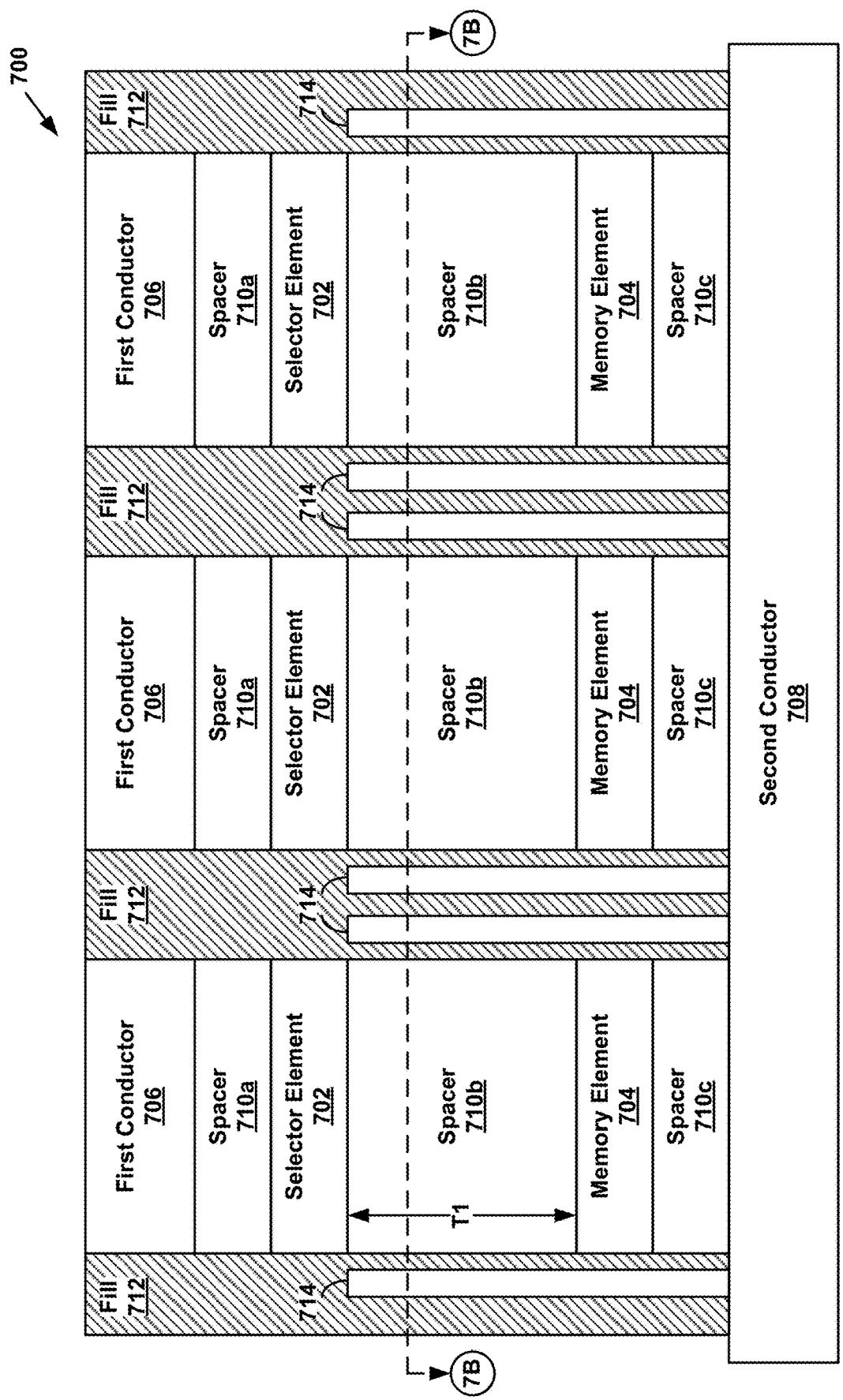
FIGS. 7A-7B depict views of an embodiment of an array of memory cells of FIG. 6A.
Figure 7B:
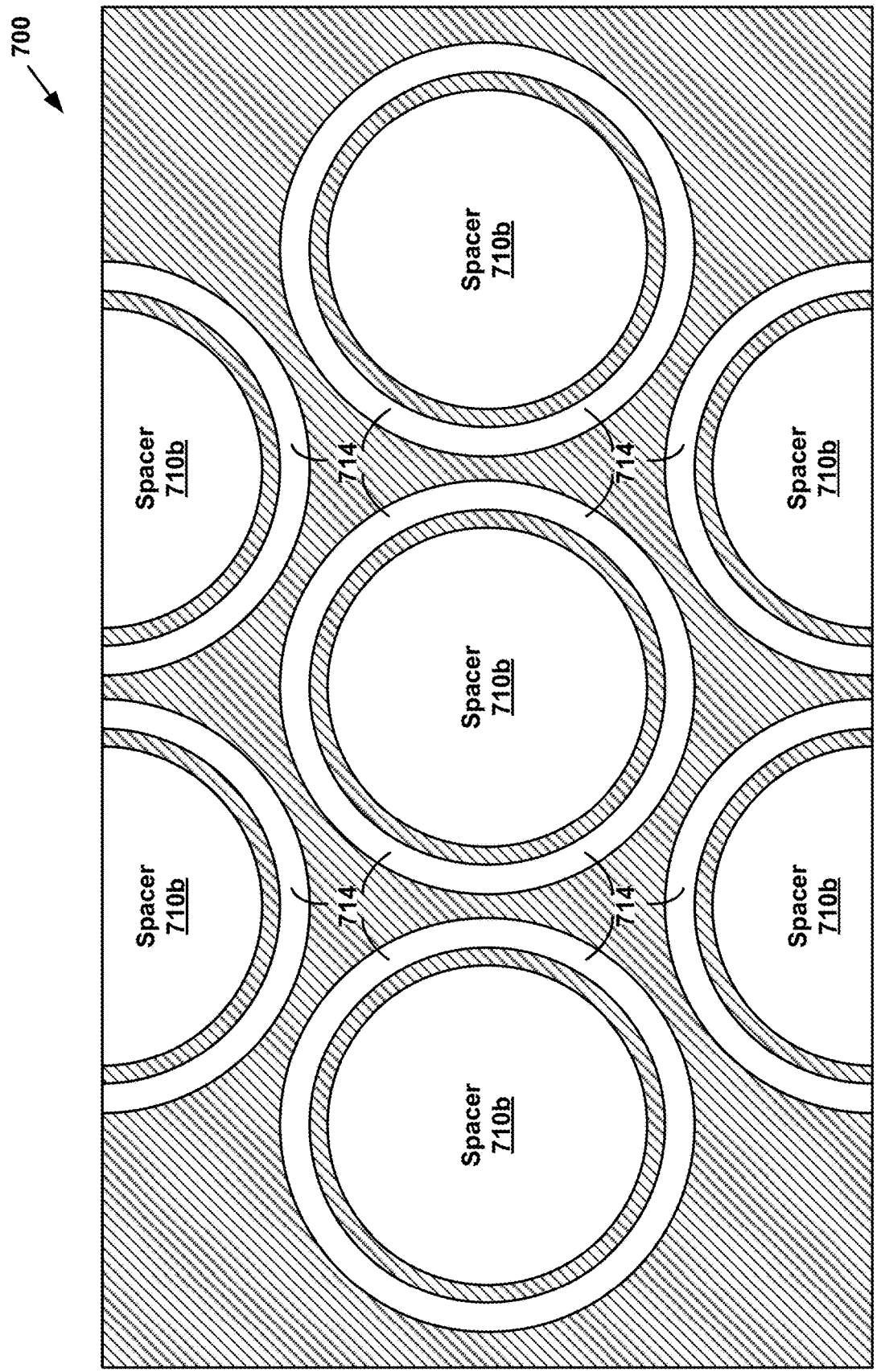

FIG. 7A depicts an example array 700 of non-volatile memory cells, such as non-volatile memory cells 226d of FIG. 6A. Each non-volatile memory cell includes a selector element 702 and an associated reversible resistance-switching memory element 704 coupled in series between a first conductor 706 (e.g., a bit line) (e.g., tungsten) and a second conductor 708 (e.g., a word line) (e.g., tungsten). In an embodiment, a conductive spacer 710a is disposed between selector element 702 and first conductor 706, a conductive spacer 710b is disposed between selector element 702 and reversible resistance-switching memory element 704, and a conductive spacer 710c is disposed between reversible resistance-switching memory element 704 and second conductor 708. In some embodiments, one or more of conductive spacers 710a and 710c may be omitted.

In an embodiment, dielectric fill 712 (e.g., silicon dioxide) is disposed on either side of first conductor 706, conductive spacers 710a-710c, selector element 702 and reversible resistance-switching memory element 704. In embodiments, conductive spacers 710a-710c may be tungsten, tungsten nitride, titanium, titanium nitride, tantalum, tantalum nitride, ruthenium, rhodium, or amorphous carbon, although other conductive materials may be used. In embodiments, conductive spacers 710a and 710c may have a thickness between about 0.5 nm and about 30 nm, although other thickness may be used. In embodiments, conductive spacer 710b may have a thickness T1 of between about 100 nm and about 1 μm, although other thickness may be used.

In an embodiment, a conductive coupler 714 is disposed about conductive spacer 710b, reversible resistance-switching memory element 704, and conductive spacer 710c, and is coupled to second conductor 708. In embodiments, the thickness of the conductive coupler 714 may be between about 1 nm and about 10 nm of tungsten, tungsten nitride, titanium, titanium nitride, tantalum, tantalum nitride, ruthenium, rhodium, or amorphous carbon, although other conductive materials and/or thicknesses may be used. In an embodiment, conductive coupler 714 has an annular shape, although other shapes may be used. In addition, the conductive couplers 714 of adjacent cells can be merged so they form a continuous matrix.

In an embodiment, conductive spacer 710b and conductive coupler 714 form capacitor Cr, with the portion of dielectric fill 712 disposed between conductive spacer 710b and conductive coupler 714 forming the capacitor dielectric layer. As described above, conductive spacer 710b may have a thickness T1 of between about 10 nm and about 1 μm, to provide few to hundreds of aF of capacitance for capacitor Cr. To prevent arcing, conductive coupler 714 should not extend past selector element 702.

The monolithic three-dimensional memory array 204 illustrated in FIGS. 2C1-2C3 includes vertical bit lines and horizontal word lines. The technology described above also may be used in other monolithic three-dimensional memory array configurations. For example, a cross-point memory array may include non-volatile memory cells each having a reversible resistance-switching memory element coupled in series with an isolation element such isolation elements 228, 228a, 228b and 228c described above and illustrated in FIGS. 2D-2G.

FIGS. 8A-8E depict various views of an embodiment of a portion of a monolithic three-dimensional memory array 800 that includes a non-volatile memory material. The physical structure depicted in FIGS. 8A-8E may include one implementation for a portion of the monolithic three-dimensional memory array depicted in FIG. 2A.

Monolithic three-dimensional memory array 800 includes vertical bit lines $LBL_{11}$-$LBL_{33}$ arranged in a first direction (e.g., a z-direction), word lines $WL_{10}$, $WL_{11}$, . . . , $WL_{43}$ arranged in a second direction (e.g., an x-direction) perpendicular to the first direction, row select lines $SG_1$, $SG_2$, $SG_3$ arranged in the second direction, and global bit lines $GBL_1$, $GBL_2$, $GBL_3$ arranged in a third direction (e.g., a y-direction) perpendicular to the first and second directions. Vertical bit lines $LBL_{11}$-$LBL_{33}$ are disposed above global bit lines $GBL_1$, $GBL_2$, $GBL_3$, which each have a long axis in the second (e.g., x-direction). Person of ordinary skill in the art will understand that monolithic three-dimensional memory arrays, such as monolithic three-dimensional memory array 800 may include more or fewer than twenty-four word lines, three row select lines, three global bit lines, and nine vertical bit lines. Although not shown in FIGS. 8A-8E, each of word lines $WL_{10}$-$WL_{43}$ may have an associated word line select transistor that may be used to connect word lines $WL_{10}$-$WL_{43}$ to global word lines using column select lines.

In an embodiment, global bit lines $GBL_1$, $GBL_2$, $GBL_3$ are disposed above a substrate 802, such as a silicon, germanium, silicon-germanium, undoped, doped, bulk, silicon-on-insulator ("SOI") or other substrate with or without additional circuitry. In an embodiment, an isolation layer 804, such as a layer of silicon dioxide, silicon nitride, silicon oxynitride or any other suitable insulating layer, is formed above substrate 802. In an embodiment, global bit lines $GBL_1$, $GBL_2$, $GBL_3$ are formed of a conductive material 806, such as tungsten or another appropriate metal, heavily doped semiconductor material, a conductive silicide, a conductive silicide-germanide, a conductive germanide, or the like deposited by any suitable method (e.g., CVD, PVD, etc.).

In an embodiment, a first dielectric material layer 808 (e.g., silicon dioxide) and a second dielectric material layer 810 (e.g., silicon dioxide) are formed above isolation layer 804. Global bit lines $GBL_1$, $GBL_2$, $GBL_3$ are disposed above isolation layer 804 and are separated from one another by first dielectric material layer 808. Row select lines $SG_1$, $SG_2$, $SG_3$ are disposed above global bit lines $GBL_1$, $GBL_2$, $GBL_3$. A first etch stop layer 812 (e.g., silicon nitride) is disposed above second dielectric material layer 810. A stack of word lines $WL_{10}$, $WL_{11}$, . . . , $WL_{43}$ is disposed above first etch stop layer 812, with a third dielectric material layer 814 (e.g., silicon dioxide) separating adjacent word lines.

A non-volatile memory cell is disposed between the intersection of vertical bit lines $LBL_{11}$-$LBL_{33}$ and word lines $WL_{10}$, $WL_{ii}$, . . . , $WL_{43}$. For example, a non-volatile memory cell $M_{111}$ is disposed between vertical bit line $LBL_{11}$ and word line $WL_{10}$, a non-volatile memory cell $M_{116}$ is disposed between vertical bit line $LBL_{13}$ and word line $WL_{13}$, a non-volatile memory cell $M_{411}$ is disposed between vertical bit line $LBL_{11}$ and word line $WL_{40}$, and so on. In an embodiment, monolithic three-dimensional memory array 800 includes seventy-two non-volatile memory cells $M_{111}$, $M_{112}$, . . . , $M_{436}$. Persons of ordinary skill in the art will understand that monolithic three-dimensional memory arrays may include more or fewer than seventy-two non-volatile memory cells.

In an embodiment, each of non-volatile memory cells $M_{111}$, $M_{112}$, . . . , $M_{436}$ includes a corresponding reversible resistance-switching memory element $R_{111}$, $R_{112}$, . . . , $R_{436}$, respectively, coupled in series with a corresponding isolation element $S_{111}$, $S_{112}$, . . . , $S_{436}$, respectively. For example, non-volatile memory cell $M_{111}$ includes reversible resistance-switching memory element $R_{111}$ coupled in series with isolation element $S_{111}$, non-volatile memory cell $M_{411}$ includes reversible resistance-switching memory element $R_{411}$ coupled in series with isolation element $S_{411}$, non-volatile memory cell $M_{116}$ includes reversible resistance-switching memory element $R_{116}$ coupled in series with isolation element $S_{116}$, and so on.

Each reversible resistance-switching memory element $R_{111}, R_{112}, \ldots, R_{436}$ may include a single material layer or multiple material layers. In an embodiment, each reversible resistance-switching memory element $R_{111}, R_{112}, \ldots, R_{436}$ is a PCM memory element 406, such as depicted in FIG. 4D. To avoid overcrowding the drawings, individual material layers 406a, 406b, 406c are not shown in FIGS. 8A-8E.

In an embodiment, each of isolation elements $S_{111}, S_{112}, \ldots, S_{436}$, includes a first selector element 402 of FIG. 4B and a second selector element 404 of FIG. 4C. To avoid overcrowding the drawings, individual material layers 402a, 402b, 402c and 404a, 404b, 404c are not shown in FIGS. 8A-8E. In embodiments, the relative positions of first selector element 402 and second selector element 404 and the corresponding reversible resistance-switching memory element can be interchanged. In embodiments, first selector element 402 and second selector element 404 can be disposed on either side of the corresponding reversible resistance-switching memory element.

In an embodiment, vertical bit lines $LBL_{11}$-$LBL_{33}$ are tungsten or other conductive material, with a thickness of between about 10 nm and about 50 nm.

Vertical bit lines $LBL_{11}$-$LBL_{33}$ are separated from one another by a fourth dielectric material layer 816 (e.g., silicon dioxide). In some embodiments, each of vertical bit lines $LBL_{11}$-$LBL_{33}$ includes a vertical structure (e.g., a rectangular prism, a cylinder, or a pillar).

Vertically-oriented bit line select transistors $Q_{11}$-$Q_{33}$ may be used to select a corresponding one of vertical bit lines $LBL_{11}$-$LBL_{33}$. Vertically-oriented bit line select transistors $Q_{11}$-$Q_{33}$ may be field effect transistors, although other transistors types may be used. Each of vertically-oriented bit line select transistors $Q_{11}$-$Q_{33}$ has a first terminal (e.g., a drain/source terminal), a second terminal (e.g., a source/drain terminal), a first control terminal (e.g., a first gate terminal) and a second control terminal (e.g., a second gate terminal).

The first gate terminal and the second gate terminal may be disposed on opposite sides of the vertically-oriented bit line select transistor. The first gate terminal may be used to selectively induce a first conductive channel between the first terminal and the second terminal of the transistor, and the second gate terminal may be used to selectively induce a second conductive channel between the first terminal and the second terminal of the transistor.

In an embodiment, the first gate terminal and the second gate terminal are coupled together to form a single control terminal that may be used to collectively turn ON and OFF the vertically-oriented bit line select transistor. Thus, the first gate terminal and the second gate terminal of each of vertically-oriented bit line select transistors $Q_{11}$-$Q_{33}$ may be used to select a corresponding one of vertical bit lines $LBL_{11}, LBL_{12}, \ldots, LBL_{33}$.

Without wanting to be bound by any particular theory, for each of vertically-oriented bit line select transistors $Q_{11}$-$Q_{33}$, it is believed that the current drive capability of the transistor may be increased by using both the first gate terminal and the second gate terminal to turn ON the transistor. For simplicity, the first and second gate terminal of each of select transistors $Q_{11}$-$Q_{33}$ will be referred to as a single gate terminal.

Figure 8A:
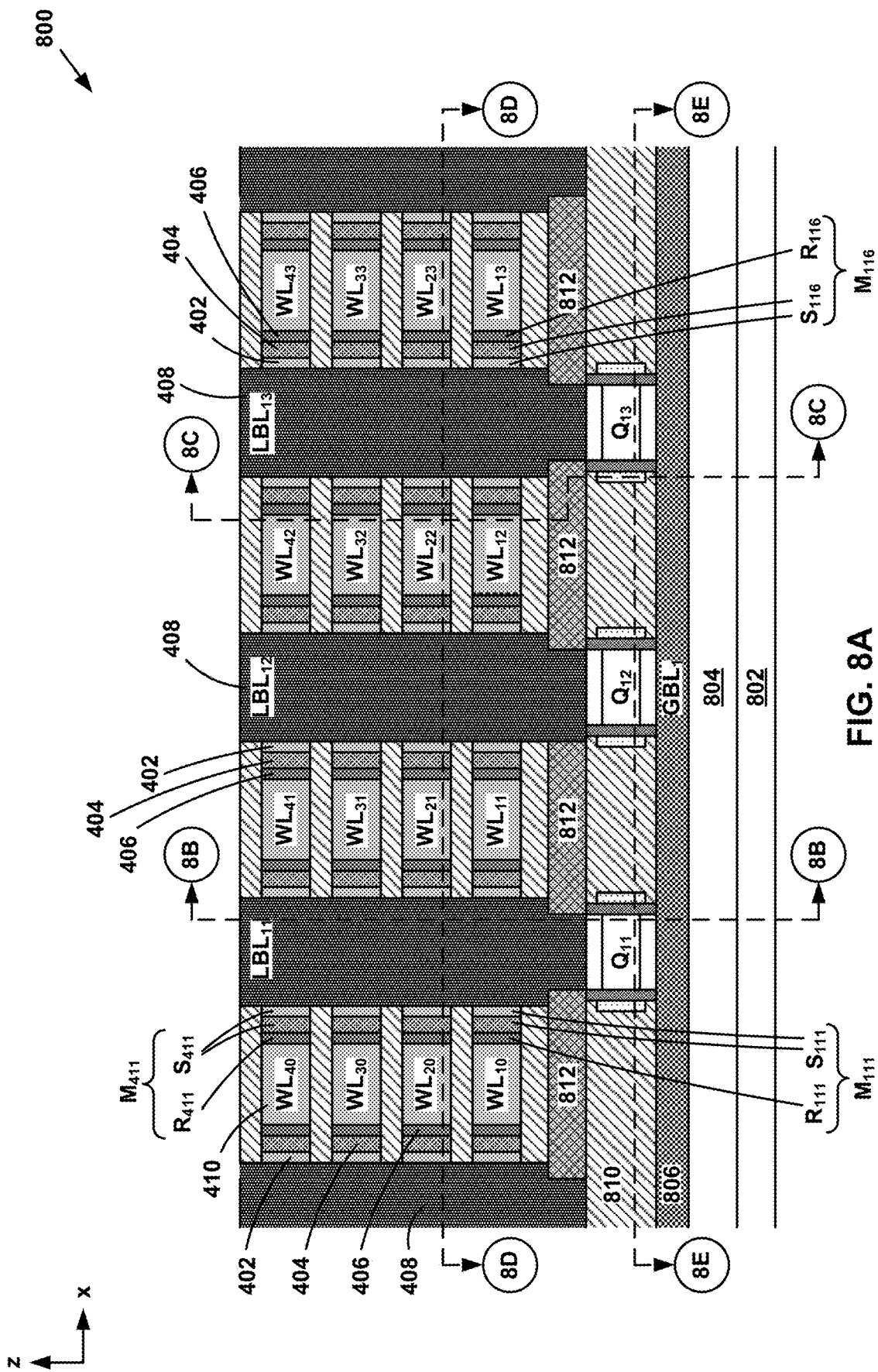
FIGS. 8A-8E depict various views of an embodiment monolithic three-dimensional memory array.
Figure 8B:
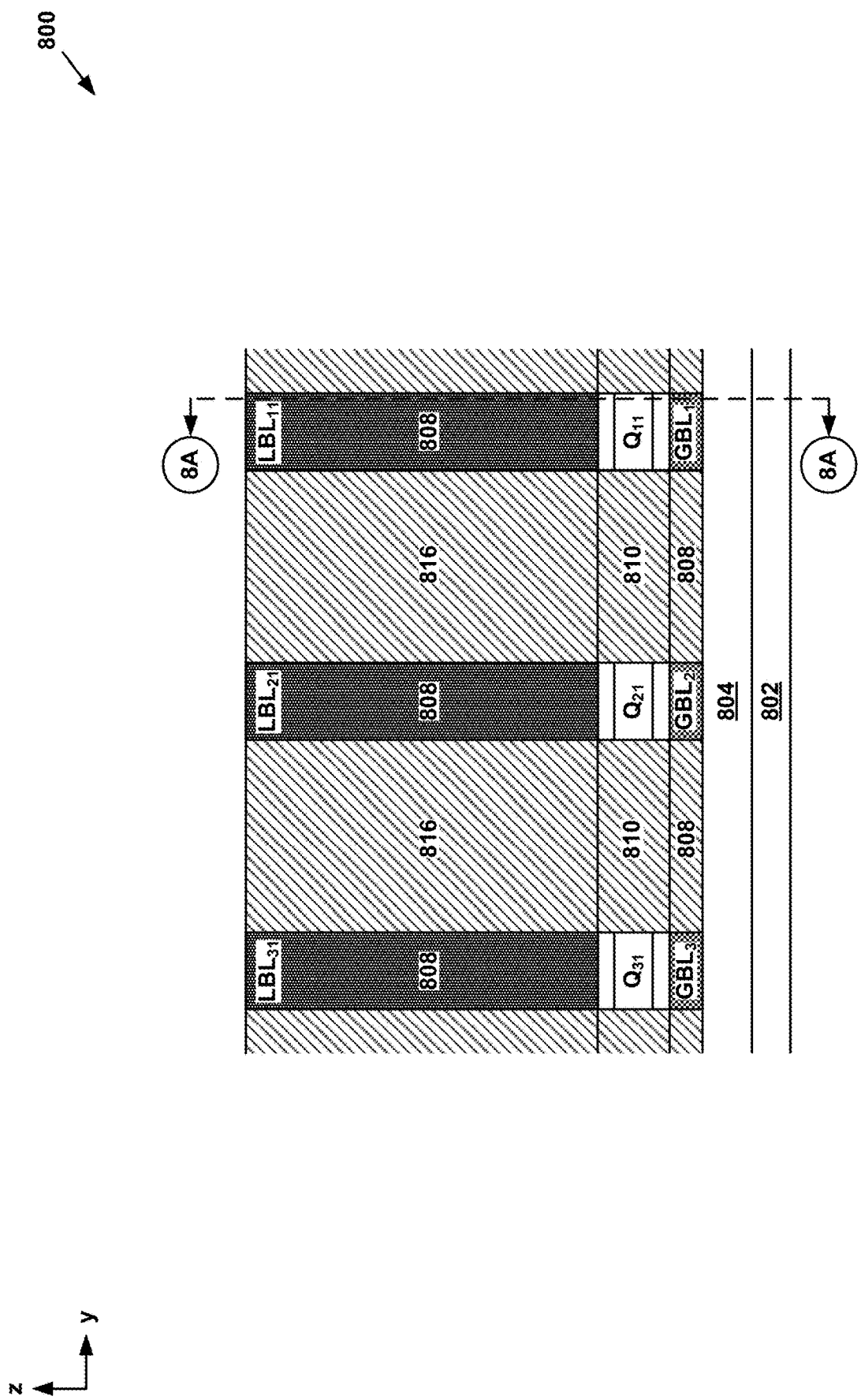
Figure 8C:
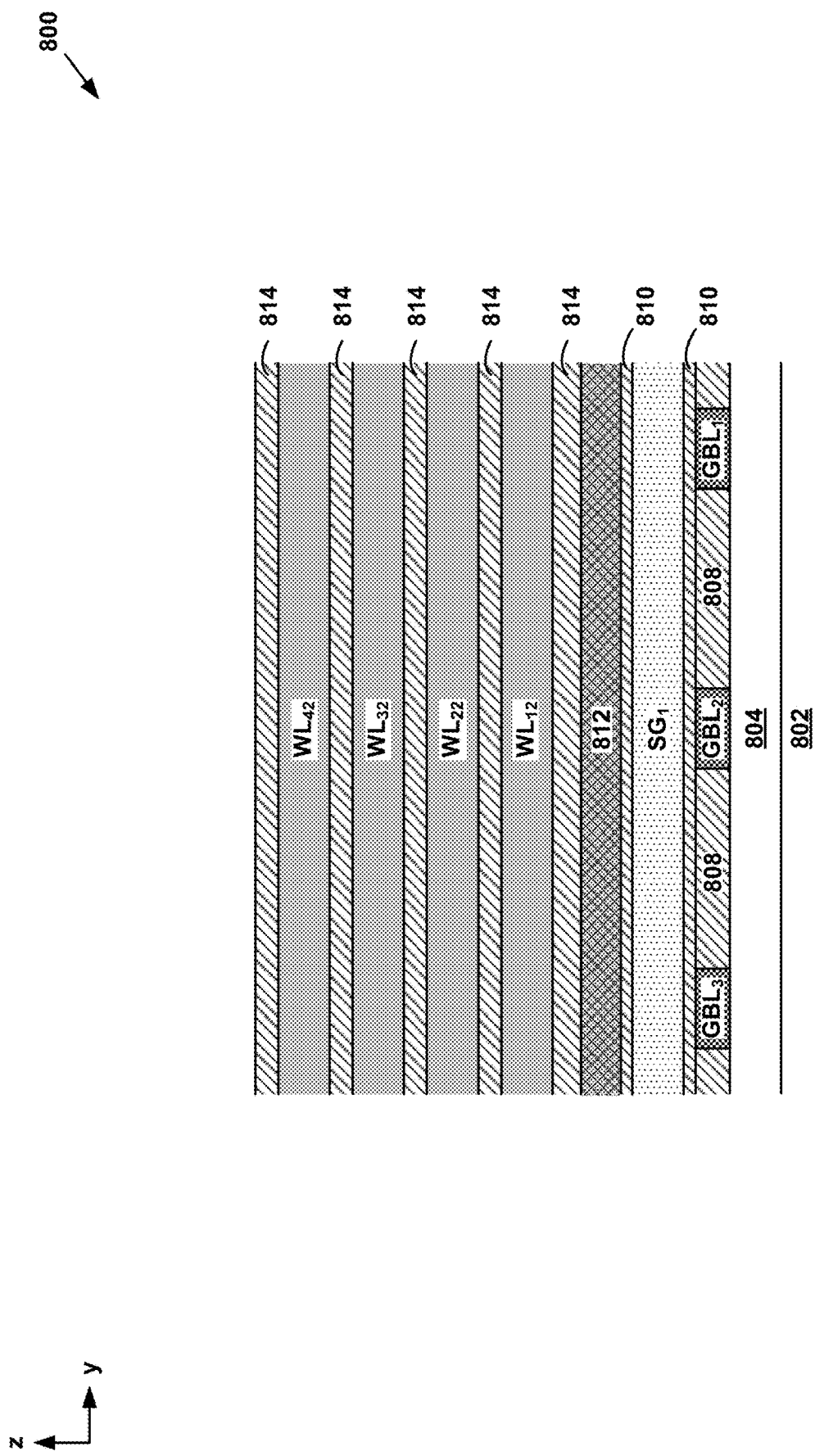
Figure 8D:
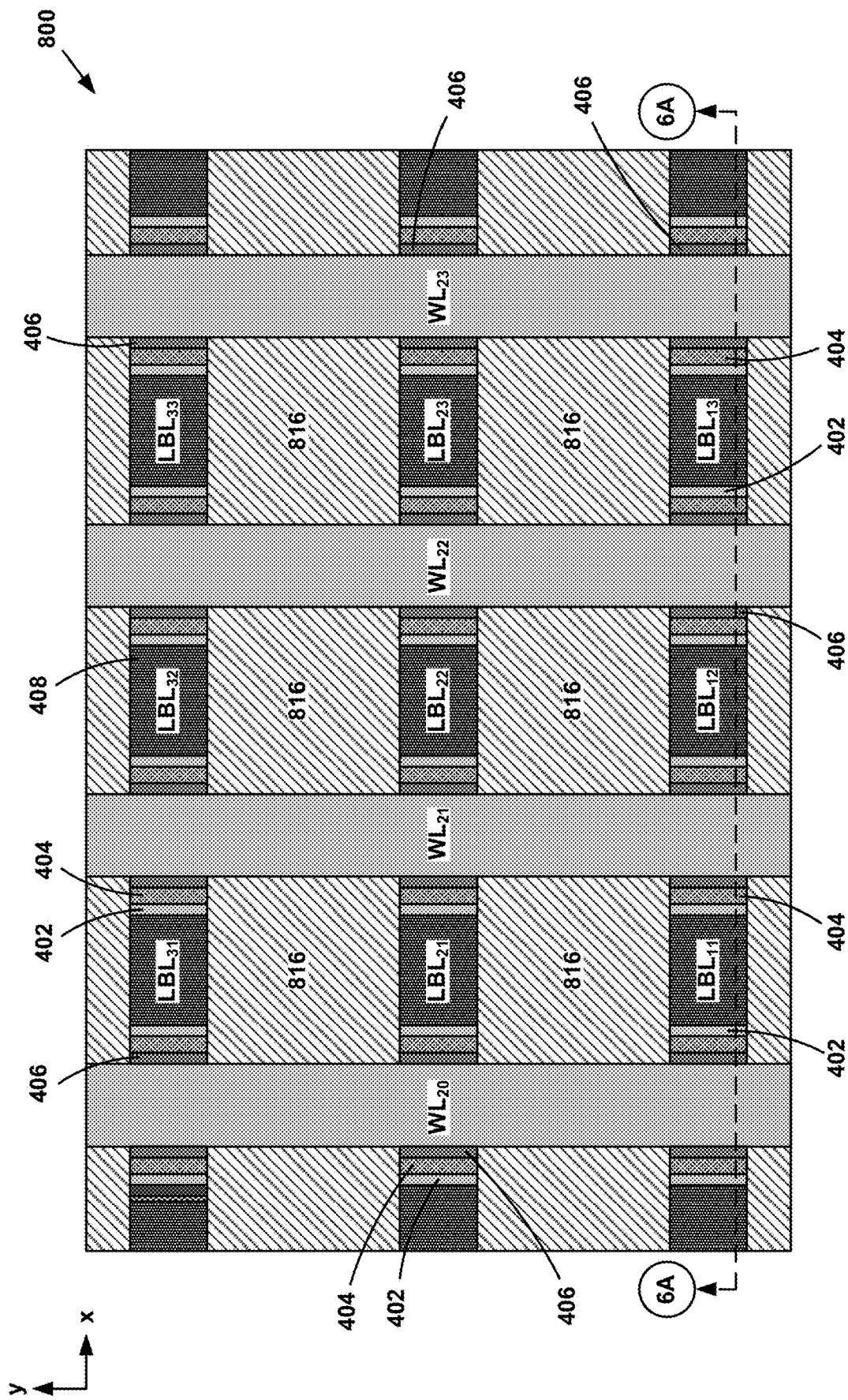
Figure 8E:
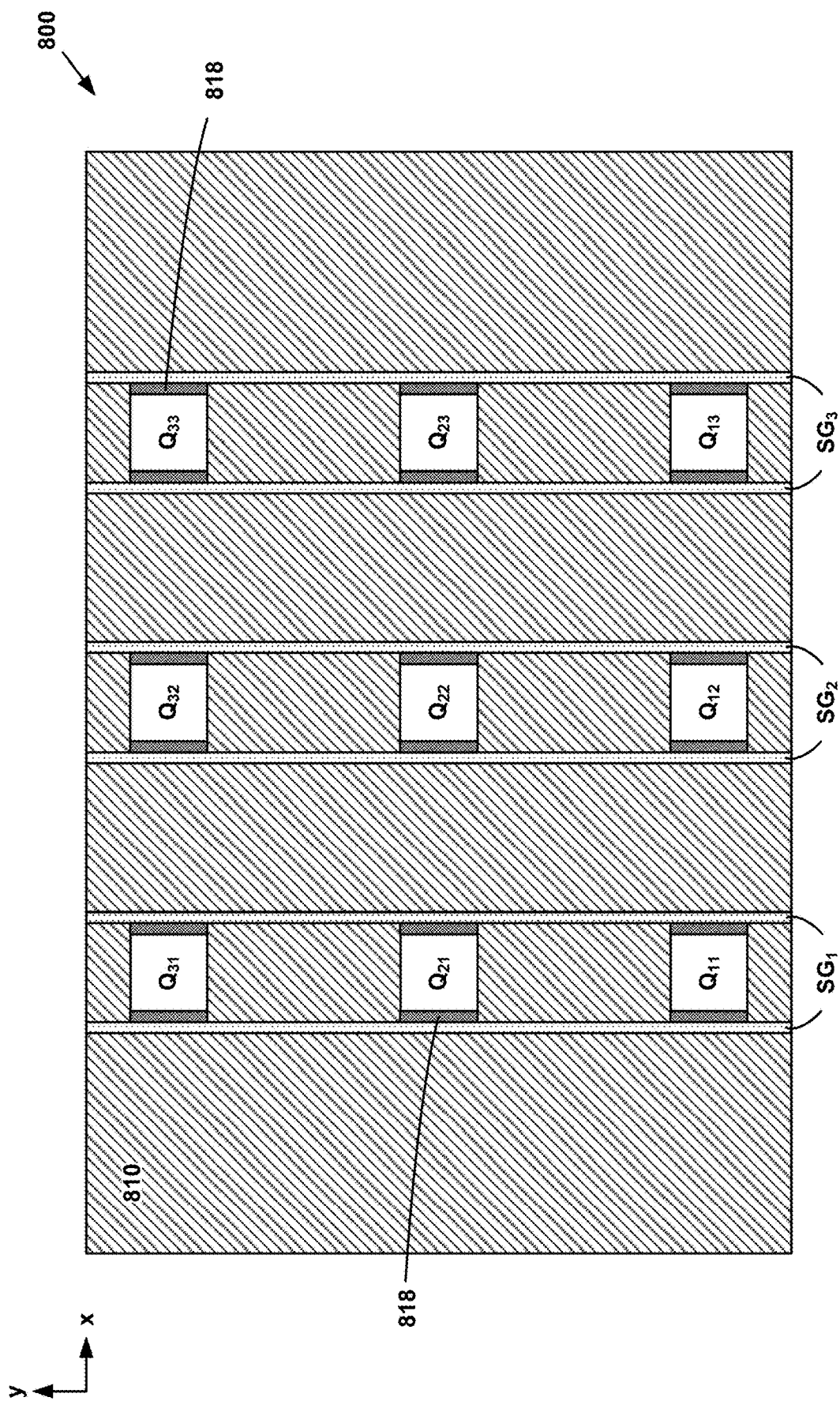

Referring to FIGS. 8A and 8E, vertically-oriented bit line select transistors $Q_{11}, Q_{12}, Q_{13}$ are used to selectively connect/disconnect vertical bit lines $LBL_{11}, LBL_{12}, LBL_{13}$ to/from global bit line $GBL_1$ using row select lines $SG_1$, $SG_2$, $SG_3$, respectively. In particular, each of vertically-oriented bit line select transistors $Q_{11}, Q_{12}, Q_{13}$ has a first terminal (e.g., a drain./source terminal) coupled to a corresponding one of vertical bit lines $LBL_{11}, LBL_{12}, LBL_{13}$, respectively, a second terminal (e.g., a source/drain terminal) coupled to global bit line $GBL_1$, and a control terminal (e.g., a gate terminal) coupled to row select line $SG_1$, $SG_2$, $SG_3$, respectively.

Row select lines $SG_1, SG_2, SG_3$ are used to turn ON/OFF vertically-oriented bit line select transistors $Q_{11}, Q_{12}, Q_{13}$, respectively, to connect/disconnect vertical bit lines $LBL_{11}$, $LBL_{12}, LBL_{13}$, respectively, to/from global bit line $GBL_1$. A gate dielectric material layer 818 (e.g., silicon dioxide) is disposed between row select lines $SG_1$, $SG_2$, $SG_3$ and vertically-oriented bit line select transistors $Q_{11}, Q_{12}, Q_{13}$.

Likewise, vertically-oriented bit line select transistors $Q_{11}, Q_{21}, \ldots, Q_{33}$ are used to selectively connect/disconnect vertical bit lines $LBL_{11}, LBL_{21}, LBL_{31}$ to global bit lines $GBL_1, GBL_2, GBL_3$, respectively, using row select line $SG_1$. In particular, each of vertically-oriented bit line select transistors $Q_{11}, Q_{21}, Q_{31}$ has a first terminal (e.g., a drain./source terminal) coupled to a corresponding one of vertical bit lines $LBL_{11}, LBL_{21}, LBL_{31}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_1$. Row select line $SG_1$ is used to turn ON/OFF vertically-oriented bit line select transistors $Q_{11}, Q_{21}, Q_{31}$ to connect/disconnect vertical bit lines $LBL_{11}, LBL_{21}, LBL_{31}$, respectively, to/from global bit lines $GBL_1$, $GBL_2$, $GBL_3$, respectively.

Similarly, vertically-oriented bit line select transistors $Q_{13}$, $Q_{23}$, $Q_{33}$ are used to selectively connect/disconnect vertical bit lines $LBL_{13}, LBL_{23}, LBL_{33}$ to/from global bit lines $GBL_1, GBL_2, GBL_3$, respectively, using row select line $SG_3$. In particular, each of vertically-oriented bit line select transistors $Q_{13}, Q_{23}, Q_{33}$ has a first terminal (e.g., a drain./source terminal) coupled to a corresponding one of vertical bit lines $LBL_{13}$, $LBL_{23}$, $LBL_{33}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_3$. Row select line $SG_3$ is used to turn ON/OFF vertically-oriented bit line select transistors $Q_{13}, Q_{23}, Q_{33}$ to connect/disconnect vertical bit lines $LBL_{13}$, $LBL_{23}$, $LBL_{33}$, respectively, to/from global bit lines $GBL_1$, $GBL_2$, $GBL_3$, respectively.

Thus, as described above, one embodiment of the disclosed technology includes an apparatus that includes a bit line above a substrate, a word line above the substrate, and a non-volatile memory cell between the bit line and the word line. The non-volatile memory cell includes a reversible resistance-switching memory element coupled in series with an isolation element. The isolation element includes a first selector element coupled in series with a second selector element. The first selector element includes a first snapback current, and the second selector element includes a second snapback current lower than the first snapback current.

One embodiment of the disclosed technology includes apparatus including a non-volatile memory cell disposed between a bit line and a word line, the non-volatile memory cell including a reversible resistance-switching memory element coupled in series with an isolation element, and a capacitor coupled between the isolation element and the reversible resistance-switching memory element.

One embodiment of the disclosed technology includes a method including forming a non-volatile memory cell between the bit line and the word line, the non-volatile memory cell including a selector element coupled in series with a reversible resistance-switching memory element, and forming a capacitor between the selector element and the reversible resistance-switching memory element. The capacitor has a value that substantially matches a parasitic capacitance of the bit line and the word line.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. Apparatus comprising:
a bit line above a substrate;
a word line above the substrate; and
a non-volatile memory cell between the bit line and the word line, the non-volatile memory cell comprising a reversible resistance-switching memory element coupled in series with an isolation element,
wherein:
the isolation element comprises a first selector element coupled in series with a second selector element; and
the first selector element comprises a first snapback current, the second selector element comprises a second snapback current lower than the first snapback current.

2. The apparatus of claim 1, wherein the first selector element comprises a first selector leakage current, the second selector element comprises a second selector leakage current, and the first selector leakage current is less than second selector leakage current.

3. The apparatus of claim 1, wherein the first selector element comprises a first selector leakage current, the second selector element comprises a second selector leakage current, the reversible resistance-switching memory element comprises a memory element leakage current, and one of the first selector leakage current and the second selector leakage current substantially equals the memory element leakage current.

4. The apparatus of claim 1, wherein the first selector element comprises a first threshold voltage, the second selector element comprises a second threshold voltage, and the first threshold voltage is lower than the second threshold voltage.

5. The apparatus of claim 4, wherein the second selector element comprises a voltage drop in a low resistance state, wherein the voltage drop substantially equals the second threshold voltage.

6. The apparatus of claim 1, wherein the first selector element and the second selector element each comprise a volatile conductive bridge.

7. The apparatus of claim 1, wherein the first selector element and the second selector element each comprise a correlated electronic switch.

8. The apparatus of claim 1, wherein the reversible resistance-switching memory element comprises a phase change memory element.

9. The apparatus of claim 1, wherein the reversible resistance-switching memory element comprises a non-volatile memory material.

10. The apparatus of claim 9, wherein the non-volatile memory material comprises one or more of a phase change material, a ferroelectric material, a metal oxide, and a barrier modulated switching structure.

11. The apparatus of claim 1, wherein the reversible resistance-switching memory element comprises a magnetic tunnel junction-based memory device.

12. Apparatus comprising:
a non-volatile memory cell disposed between a bit line and a word line, the non-volatile memory cell comprising:
a reversible resistance-switching memory element coupled in series with an isolation element; and
a capacitor coupled between the isolation element and the reversible resistance-switching memory element.

13. The apparatus of claim 12, wherein the isolation element comprises a first selector element, and the capacitor is coupled between the first selector element and the reversible resistance-switching memory element.

14. The apparatus of claim 12, wherein the isolation element comprises a first selector element and a second selector element, and the capacitor is coupled between the first selector element and the second selector element.

15. The apparatus of claim 12, wherein the isolation element comprises a first selector element coupled in series with a second selector element, the first selector element comprises a first selector switching time, and the second selector element comprises a second selector switching time greater than the first selector switching time.

16. The apparatus of claim 12, wherein the isolation element comprises a first selector element coupled in series with a second selector element, wherein the first selector element comprises a first selector leakage current, and the second selector element comprises a second selector leakage current greater than the first selector leakage current.

17. The apparatus of claim 12, wherein the non-volatile memory cell further comprises a resistor coupled between the reversible resistance-switching memory element coupled and the isolation element.

18. The apparatus of claim 12, wherein the isolation element comprises a correlated electronic switch.

19. The apparatus of claim 12, wherein the reversible resistance-switching memory element comprises a phase change memory element.

20. The apparatus of claim 12, wherein the reversible resistance-switching memory element comprises one or more of a phase change material, a ferroelectric material, a metal oxide, and a barrier modulated switching structure.

21. A method comprising:
forming a non-volatile memory cell between a bit line and a word line, the non-volatile memory cell comprising a selector element coupled in series with a reversible resistance-switching memory element; and forming a capacitor between the selector element and the reversible resistance-switching memory element, wherein the capacitor has a value that substantially matches a parasitic capacitance of the bit line and the word line.

* * * * *